United States Patent
Matsumoto et al.

(10) Patent No.: US 7,643,961 B2
(45) Date of Patent: Jan. 5, 2010

(54) POSITION DETECTING DEVICE AND POSITION DETECTING METHOD

(75) Inventors: Takahiro Matsumoto, Tochigi (JP); Hideki Ina, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 170 days.

(21) Appl. No.: 11/474,331

(22) Filed: Jun. 26, 2006

(65) Prior Publication Data

US 2006/0241894 A1    Oct. 26, 2006

Related U.S. Application Data

(63) Continuation of application No. 11/190,168, filed on Jul. 27, 2005, now Pat. No. 7,103,497, which is a continuation of application No. 10/662,408, filed on Sep. 16, 2003, now Pat. No. 6,999,893.

(30) Foreign Application Priority Data

Sep. 24, 2002    (JP)    ............... 2002-277302

(51) Int. Cl.
*G01C 17/00*    (2006.01)
(52) U.S. Cl. .................................... 702/150
(58) Field of Classification Search ............ 702/150
See application file for complete search history.

(56) References Cited

U.S. PATENT DOCUMENTS

| | | | |
|---|---|---|---|
| 4,669,883 A | 6/1987 | Ina et al. ............ 356/401 |
| 4,777,641 A | 10/1988 | Inagaki et al. ......... 378/34 |
| 4,883,359 A | 11/1989 | Ina et al. ............ 356/401 |
| 4,971,444 A | 11/1990 | Kato ................. 356/375 |
| 5,133,603 A | 7/1992 | Suzuki et al. ........ 356/400 |
| 5,200,840 A * | 4/1993 | Koike et al. ......... 358/451 |
| 5,418,613 A * | 5/1995 | Matsutani ........... 356/401 |
| 5,659,384 A | 8/1997 | Ina .................. 355/53 |
| 5,680,200 A | 10/1997 | Sugaya et al. ......... 355/53 |
| 5,760,411 A | 6/1998 | Kawakubo ........... 250/548 |
| 5,777,729 A * | 7/1998 | Aiyer et al. ......... 356/237.1 |
| 6,151,120 A | 11/2000 | Matsumoto et al. ..... 356/399 |
| 6,285,033 B1 | 9/2001 | Matsumoto ........... 250/548 |
| 6,493,065 B2 | 12/2002 | Ina et al. ............ 355/53 |
| 6,529,625 B2 | 3/2003 | Sentoku et al. ........ 382/151 |
| 6,563,573 B1 | 5/2003 | Morohoshi et al. ...... 356/124 |
| 6,844,918 B2 | 1/2005 | Navarro Y Koren et al. ... 355/53 |
| 6,999,893 B2 * | 2/2006 | Matsumoto et al. ..... 702/150 |
| 7,103,497 B2 * | 9/2006 | Matsumoto et al. ..... 702/150 |
| 2001/0046315 A1 | 11/2001 | Sentoku et al. ........ 382/151 |

(Continued)

FOREIGN PATENT DOCUMENTS

JP    2004-282017    10/2004

*Primary Examiner*—Tung S Lau
(74) *Attorney, Agent, or Firm*—Fitzpatrick, Cella, Harper & Scinto

(57) ABSTRACT

A position detection method of detecting a position of a mark. The method includes steps of detecting light from the mark under a first detecting condition to obtain a position of the mark as a first position, detecting light from the mark under a second detecting condition different from the first detecting condition to obtain a position of the mark as a second position, obtaining previously prepared data for relating a difference between the first and second positions to offset data for offsetting one of the first and second positions, and detecting the position of the mark based on the first and second positions and the previously prepared data.

14 Claims, 21 Drawing Sheets

U.S. PATENT DOCUMENTS

| | | | |
|---|---|---|---|
| 2002/0085184 A1* | 7/2002 | Amano | 355/30 |
| 2002/0175300 A1 | 11/2002 | Suzuki et al. | 250/548 |
| 2002/0176096 A1 | 11/2002 | Sentoku et al. | 356/620 |
| 2004/0114143 A1 | 6/2004 | Van Haren et al. | 356/401 |
| 2004/0129900 A1 | 7/2004 | Den Boef et al. | 250/559.3 |

* cited by examiner

FIG. 5
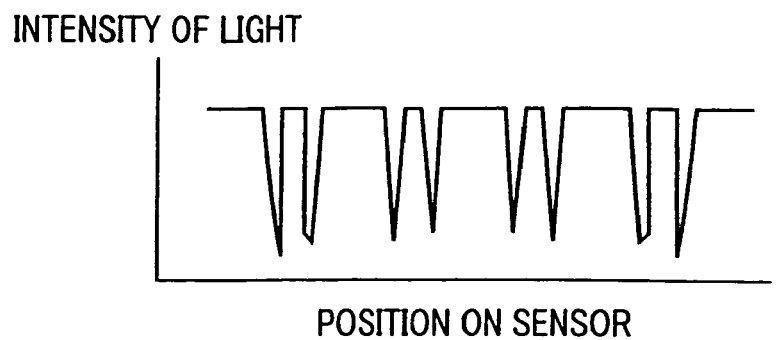
INTENSITY OF LIGHT
POSITION ON SENSOR
FIG. 6A  T 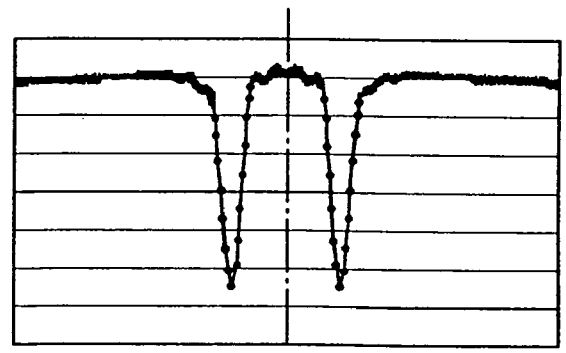
FIG. 6B  S 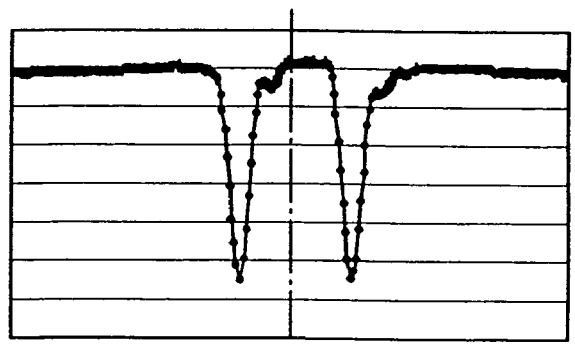
FIG. 6C  E 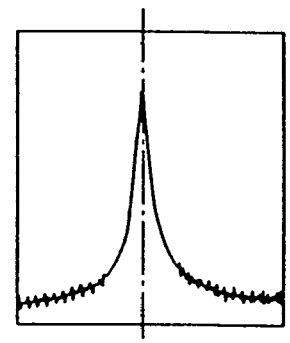

POSITION DETECTING DEVICE AND POSITION DETECTING METHOD

This application is a continuation of copending U.S. patent application Ser. No. 11/190,168, filed Jul. 27, 2005, which is a continuation of U.S. patent application Ser. No. 10/662,408, filed Sep. 16, 2003, and which issued as U.S. Pat. No. 6,999,893 on Feb. 14, 2006.

BACKGROUND OF THE INVENTION

1. Field of the Invention

The present invention relates to a position detecting device and a position detecting method, and, particularly, to a position detecting device and a position detecting method effective with regard to wafer alignment in semiconductor exposure devices.

2. Description of the Related Art

Increasingly miniaturized and high-density circuits necessitate that semiconductor device manufacturing projection exposure apparatuses be able to project circuit patterns on reticles onto wafer surfaces for exposure at even higher resolution. The projection resolution of a circuit pattern depends on the apertures (NA) of the projection optical system and on the exposing light wavelength, so methods are being employed for raising the resolution, such as increasing the NA of the projection optical system or using light having a shorter wavelength for exposure. With regard to the latter, the exposure light source has made a transition from g rays to i rays, and from i rays to the excimer laser. Exposure devices using an excimer laser with an oscillation wavelength of 248 nm and 193 nm are already in practical use.

Currently, even shorter wavelength VUV exposure using a wavelength of 157 nm, and EUV exposure using a wavelength of around 13 nm, are being studied as candidates for next-generation exposure.

Also, there is an increasing variety in semiconductor device manufacturing processes, and CMP (Chemical Mechanical Polishing) processes and the like are being introduced as smoothing techniques to resolve the problem of insufficient depth of the exposure apparatus.

Also, there is a great variety of structures and materials for the semiconductor devices, with the P-HEMT (Pseudomorphic High Electron Mobility Transistor) and M-HEMT (Metamorphe-HEMT) made up of a combination of compounds, such as GaAs or InP, or the like, and HBT (Heterojunction Bipolar Transistor) using SiGe or SiGeC, or the like, for example, being proposed.

On the other hand, increased miniaturization of the circuit pattern means that highly-precise alignment between the reticle upon which the circuit pattern is formed and the wafer upon which the pattern is cast is accordingly necessary. The required precision is ⅓ of the circuit line width, so with a current design using 180 nm, for example, the required precision is 60 nm.

Alignment in an exposure apparatus is performed by exposure transferring of alignment marks on the wafer at the same time as the circuit pattern on the reticle, optically detecting the position of the alignment marks at the time of exposing the circuit pattern of the next reticle on the wafer, and positioning the wafer as to the reticle. Techniques for detecting the alignment include a method wherein the alignment marks are enlarged and taken with a microscope so as to detect the position of the mark image, a method wherein a diffraction grating is used as alignment marks so as to detect the phase of interference signals from interference with the diffraction light therefrom, thereby detecting the position of the diffraction grating, and so forth.

In the current situation of the semiconductor industry, as described above, improving the precision of overlaying on device wafers at the time of using exposure apparatuses is an issue, which is crucial in improving the capabilities of the semiconductor devices and improving production yield. However, the fact is that while circuit patterns can be configured well due to introduction of special semiconductor manufacturing techniques such as CMP processing and the like, but irregularities in alignment mark shape occur from one wafer to another or from one shot to another, resulting in non-symmetric alignment mark structures, frequently bringing about deterioration in the alignment precision.

The cause of non-symmetric alignment mark structures can be attributed to an increased difference between the line width of the circuit pattern and the line width of the alignment mark, due to increasingly miniaturized circuit patterns. The process conditions for film formation, etching, CMP, etc., are optimized for the line width of the circuit patterns (a line width of 0.1 to 0.15 μm), so structures with a line width in generally the same order do not become non-symmetric, but the alignment marks with a large line width in comparison with the circuit patterns (a line width of 0.6 to 4.0 μm) do not match the optimal process conditions, and accordingly, may turn out being non-symmetric. Attempting to match the line width of the alignment marks with the line width of the circuit patterns results in the signal intensity or contrast deteriorating due to insufficient resolution of the detection optical system used for alignment, leading to poorer stability in alignment signals. A detection optical system capable of detecting alignment marks with the same line width as the circuit patterns would require an alignment light source with a large NA and a short wavelength, which is a detection optical system on the same level as with the projection optical system, leading to a new problem of increased costs for the apparatus.

Currently, this issue is being dealt with by changing the process conditions by trial and error so as to be suitable for both the alignment marks and circuit patterns, or to make several types of alignment mark line widths for exposure evaluation, and use the alignment marks with the best line width.

Accordingly, this has required great amounts of time for determining optimal conditions (parameters). Also, even after parameters are determined, in the event that a process error, or the like, occurs, there is the need to change the parameters for the manufacturing apparatus accordingly, with the changes in the manufacturing process, which requires a great amount of time again. Moreover, even more miniaturized circuit patterns, new semiconductor processes, 300 mm wafers, and so forth, are expected to make manufacturing with no defects on the whole surface of a wafer in both the circuit patterns and alignment marks even more difficult.

SUMMARY OF THE INVENTION

The present invention has been made in light of the above-described present state, and accordingly, it is an object of the present invention to achieve a high-precision position detecting method and position detecting device to serve as an alignment or overlaying detection device in an exposure apparatuses used in manufacturing semiconductor devices, wherein position detection precision is not lost even in the event that the alignment marks to be used are not symmetric, or further in the event that there are irregularities in the non-symmetry of multiple alignment marks within the same wafer.

The position detection method for detecting the position of marks according to the present invention comprises the following steps: a step for detecting first information relating to the position of the mark by detecting light from the mark under first measurement conditions; a step for detecting second information relating to the position of the mark by detecting light from the mark under second measurement conditions, which differ from the first measurement conditions; and a step for detecting the position of the mark based on the first and second information.

Due to such an arrangement, even in the event that there are irregularities in the non-symmetry of alignment marks from one shot to another or from one wafer to another at the time of executing global alignment, the measurement error due to the non-symmetry can be corrected based on measurement values measured under two different conditions, so measurement is not readily affected by structural change of the alignment marks due to the semiconductor processes, alignment precision can be improved, and yield in the semiconductor device manufacturing process can be improved. Further, the time for calculating the conditions for the semiconductor process which has been necessary in order to stabilize the shape of the alignment marks so far can be reduced, thereby improving the productivity of semiconductor device manufacturing, as well.

BRIEF DESCRIPTION OF THE DRAWINGS

FIG. 5 is a diagram illustrating an example of alignment signals.

FIGS. 6A through 6C are diagrams illustrating a template matching method according to a first embodiment of the present invention.

DESCRIPTION OF THE PREFERRED EMBODIMENTS

The following is a description of preferred embodiments of the present invention with reference to the attached drawings.

First Embodiment

Figure 1:
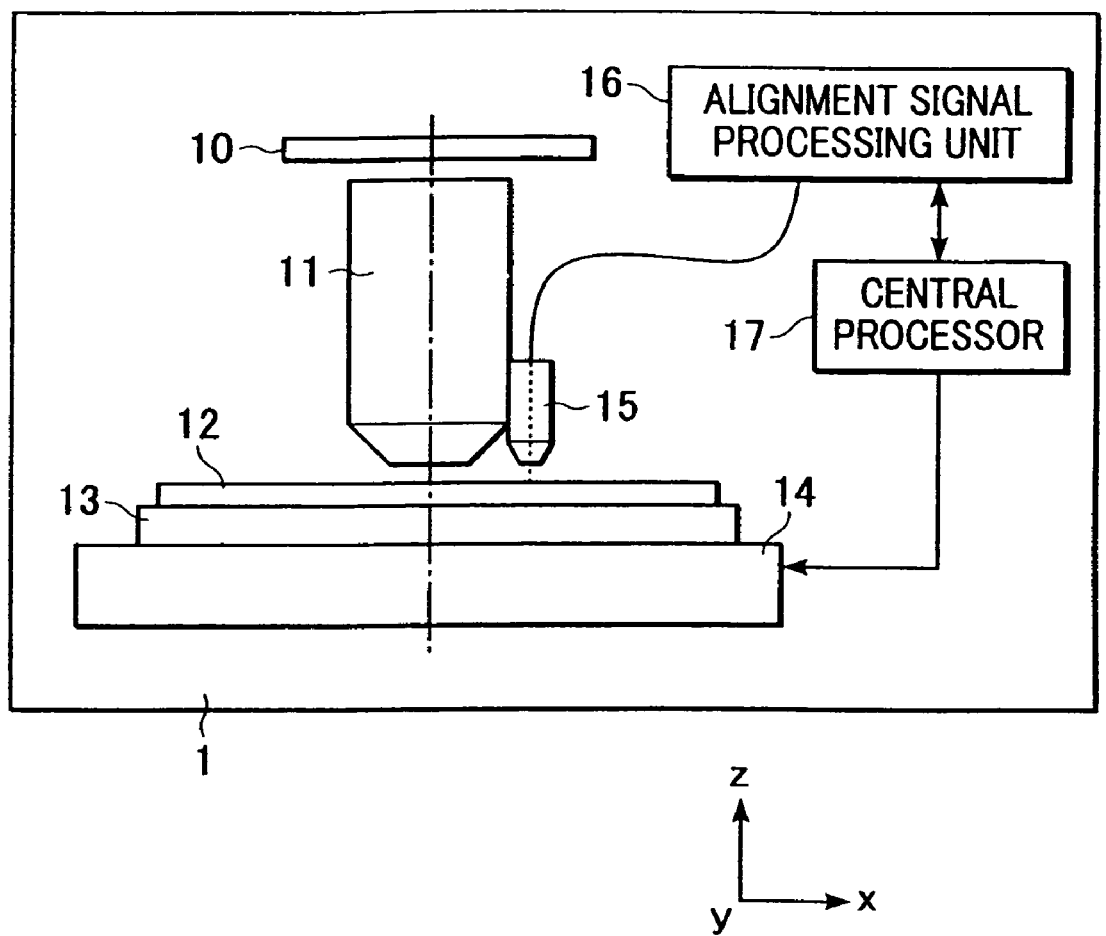
FIG. 1 is a diagram illustrating an embodiment of a management system for a semiconductor exposure apparatus according to the present invention.

FIG. 1 is a schematic diagram of a semiconductor exposure apparatus according to the present invention. Note that only the portions necessary for describing the embodiments are shown, and the other portions are omitted in the drawings. The exposure apparatus 1 is configured of a reduction projection optical system 11 for reduced projection of a reticle 10 upon which a circuit pattern has been drawn, a wafer chuck 13 for holding a wafer 12 upon which a base pattern and alignment marks have been formed in previous processes, a wafer stage 14 for positioning the wafer 12 to a predetermined position, an alignment detection optical system 15 for measuring the position of the alignment marks on the wafer, and so forth.

Figure 2:
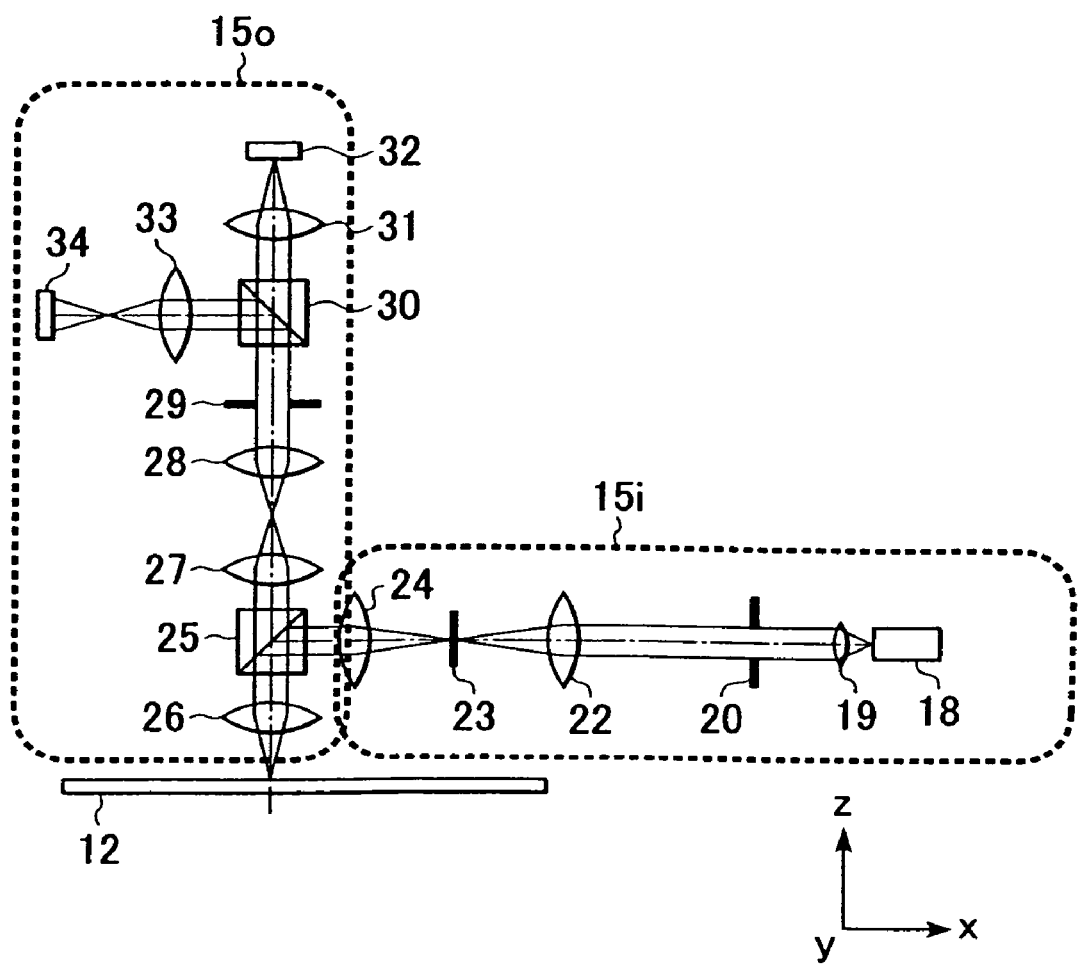
FIG. 2 is a diagram illustrating an alignment scope according to the present invention.

Next, the principle of alignment detection will be described. FIG. 2 illustrates the principal components of the alignment detection optical system 15. FIG. 2 is an example of an optical system for detecting position in the x direction, and a description of the x-directional detection system will be made, since y-directional detection can be performed by a system rotated 90° on the z axis (x-directional marks which are rotated 90° on the z axis are used for the y-directional marks, as well). The alignment detection optical system 15 is configured of an illumination system 15$i$ and an imaging system 15$o$.

Illumination light from a light source 18 is enlarged at a lens 19 to become parallel rays, and then is condensed again at a lens 22. The coherency (σ) of the illumination light is adjusted by a variable opening diaphragm 20. An aperture 23 is disposed at a position conjugate with the wafer 12, and serves as a view field aperture to prevent unnecessary light from being cast on the surrounding areas of the alignment marks on the wafer 12. The light collected by the lens 22 is formed into parallel rays again at the lens 24, reflected at a beam splitter 25, passes through a lens 26, and illuminates an alignment mark 50 on the wafer 12. The reflected light from the alignment mark 50 passes through the lens 26, beam splitter 25, lenses 27 and 28, is split at the beam splitter 30, and is received at line sensors 32 and 34. The aperture (NA) of the imaging system can be adjusted by the variable opening diaphragm 29. The alignment mark 50 is enlarged at an imaging magnification of around one hundred times, and is imaged at the line sensor 32. On the other hand, the image received at the line sensor 34 is situated at a position intentionally offset from the best focus position in the direction of the optical axis, so that the line sensor 34 can detect signals of a defocused image while the line sensor 32 detects the best focus image signals. Two-dimensional area sensors can also be used for the sensors 32 and 34.

Figure 3:
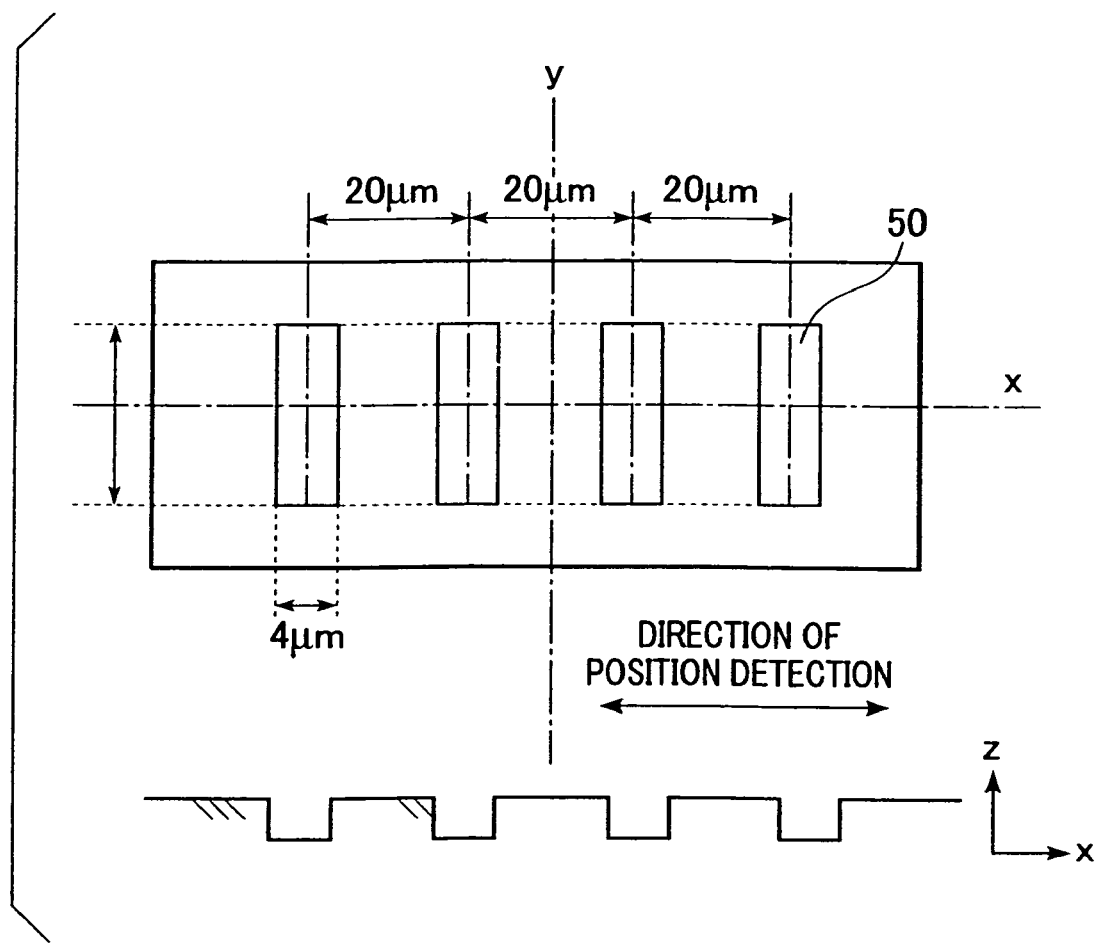
FIG. 3 is a diagram illustrating a first example of alignment marks according to the present invention.
Figure 4:
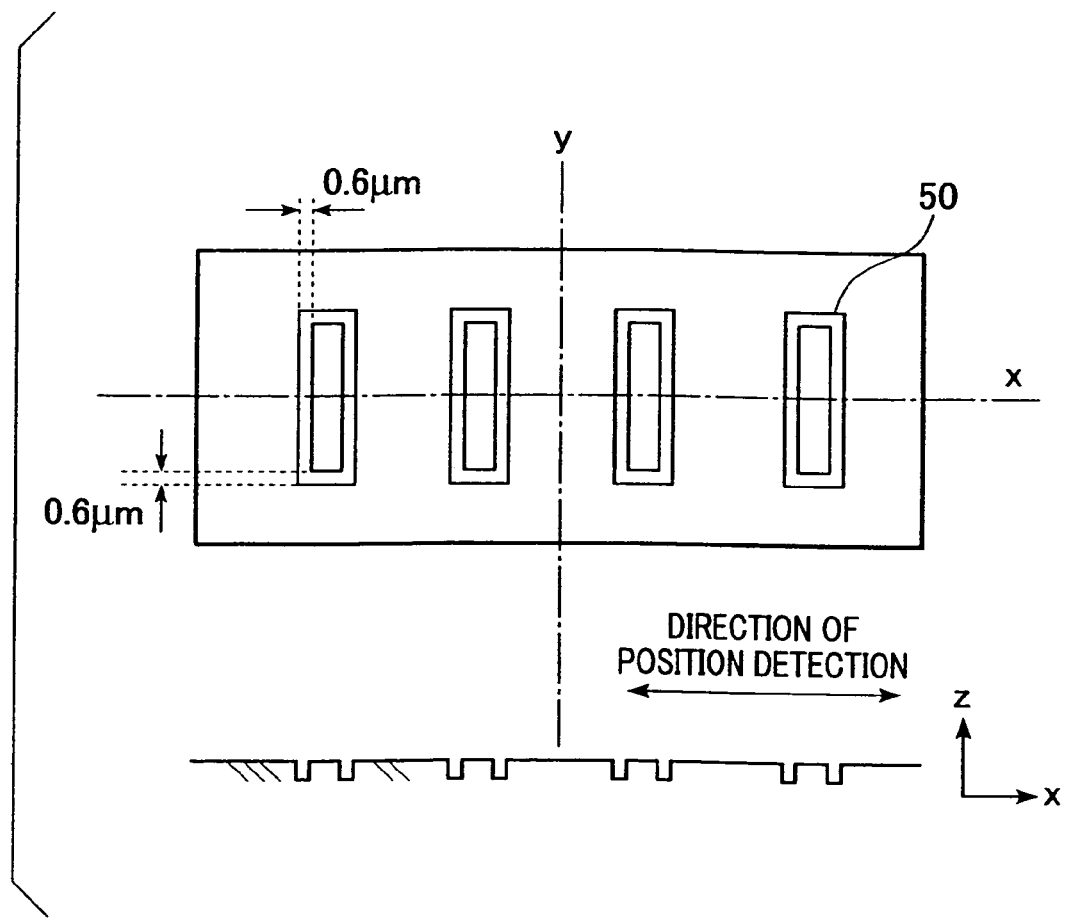
FIG. 4 is a diagram illustrating a second example of alignment marks according to the present invention.

As for the alignment mark 50, marks having a shape such as shown in FIGS. 3 or 4 are used. In FIG. 3, four rectangular marks, which are 4 μm in the X directions which is the measurement direction, and 20 μm in the Y direction, which is the non-measurement direction, are arrayed at a 20 μm pitch. The mark portion has a recessed cross-sectional form, since it is formed by etching. While resist is applied to the mark portion in real cases, this is not shown in the drawings. On the other hand, the arrangement shown in FIG. 4 has the outline portions of the marks shown in FIG. 3 substituted by 0.6 μm wide lines. Whichever of the alignment marks in FIGS. 3 and 4 is used, the image taken by the line sensors 32 and 34 is as shown in FIG. 5, due to scattered light at the edge portions at angles too great to enter the NA of the lens of the alignment detection system 15, and interference with the scattered light at the edge portion. The outlines of the alignment marks shown in FIG. 3 are dark, and the recesses of the alignment marks shown in FIG. 4 are dark or bright. This is an image often observed in bright field images, and is characteristic thereof.

Now, the alignment mark image taken in this way is processed with alignment signal processing means 16 as described below. Template matching is used for calculating the alignment mark position used with the present embodiment. With template matching, correlation computation is performed between the obtained signals, which are indicated by S in FIG. 6B and the template T shown in FIG. 6A, which the apparatus has beforehand, wherein the position with the highest correlation is detected as the center of the positioning mark. In the correlation value function indicated by E in FIG. 6C, resolution of 1/10 to 1/50 pixels can be achieved by obtaining the center-of-gravity pixel position of an area of several pixels in the horizontal direction from the peak pixel. Template matching is expressed by the following Expression.

[Expression 1]

$$E(X) = \frac{1}{\sum_{J=k}^{k}[S(X+J)-T(J)]^2} \quad (1)$$

wherein S represents signals obtained with the sensor, T represents the template, and E represents the correlation results.

FIGS. 6A through 6C show the method for processing one of the four alignment mark images. The position of the other three alignment mark images on the sensor are detected by template matching, as well. The template matching yields the mark image positions X1(n), X2(n), X3(n), and X4(n), in increments of pixels, wherein n represents the template number.

Subsequently, the average position of the marks is obtained by

[Expression 2]

$$Xa(n)=[X1(n)+X2(n)+X3(n)+X4(n)]/4. \quad (2)$$

The positional offset Xw(n) of the alignment mark 50 on the wafer obtained for each template can be obtained as

[Expression 3]

$$Xw(n)=Xa(n)/(Px.M) \quad (3)$$

wherein M represents the imaging magnification of the alignment scope 15 and Px represents the pixel pitch of the alignment measurement direction of the area sensor 23. The positional offset amount X1 of the alignment mark from the best focus image signals obtained from the line sensor 32 and the positional offset amount X2 of the alignment mark from the line sensor 34 are obtained based on Expression (3).

The alignment mark position X is determined using these two position offset measurement values. The processing method thereof will be described later in detail.

Next, the method for aligning the wafer based on the position measurement values of the alignment mark will be described. The present embodiment uses global alignment known as AGA (Advanced Global Alignment). With global alignment, several shots of all of the chips (shots) on the wafer are selected (the selected shots are called "sample shots"), and the positions of the alignment marks within the shots are detected.

Figure 7:
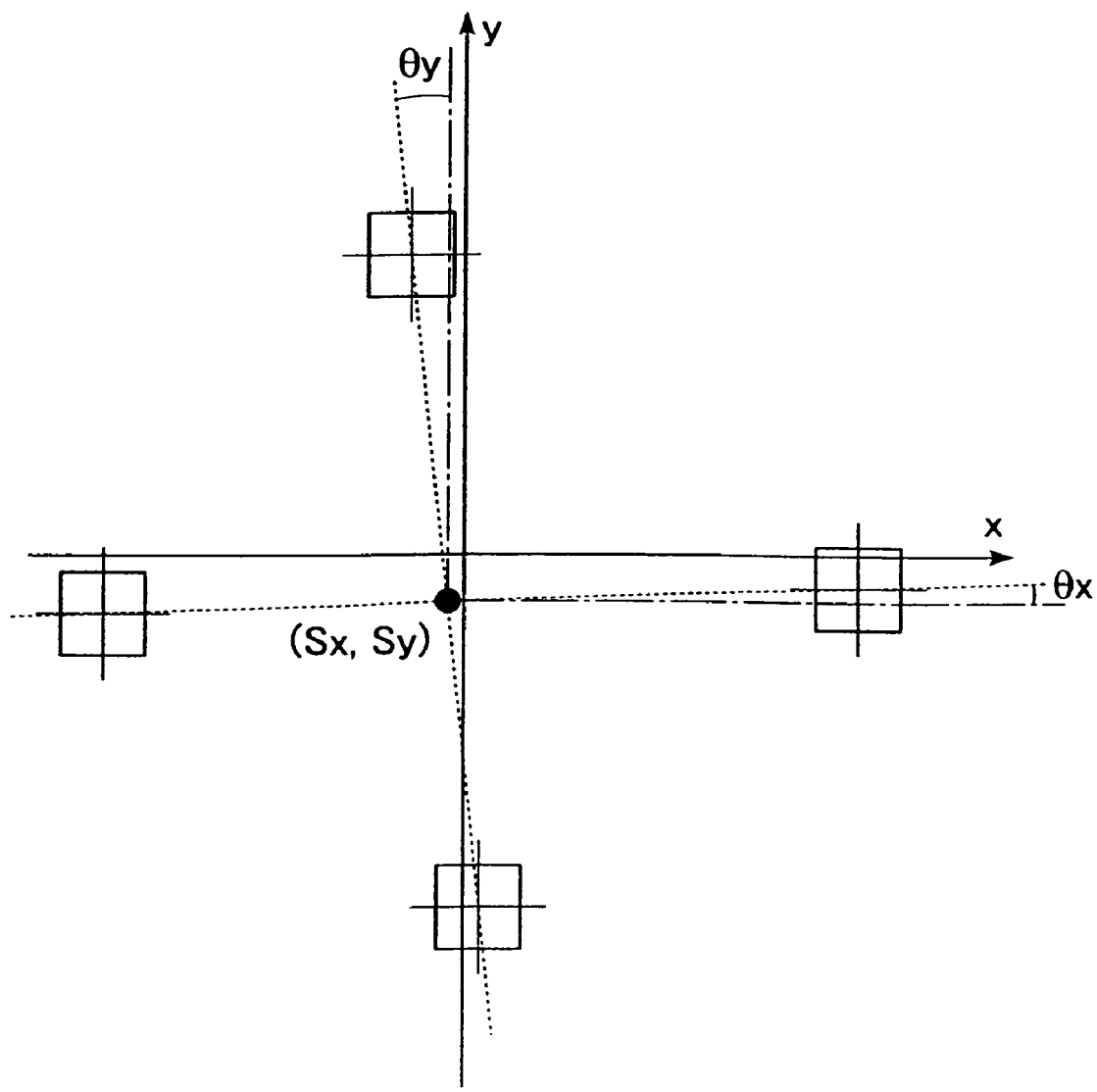
FIG. 7 is a diagram describing global alignment.

FIG. 7 illustrates the way in which the shots on the wafer are arrayed with regard to the x-y coordinates system on the wafer stage of the exposure apparatus 1. Wafer offset can be described by the six parameters of x-directional shift Sx, y-directional shift Sy, inclination θx as to the x axis, inclination θy as to the y axis, x-directional magnification Bx, and y-directional magnification By. Bx and By represents the expansion of shrinkage of the wafer with wafer stage feeding by the exposure apparatus as a reference, a phenomenon which occurs due to heating the wafer for film formation, etching, and so forth, in the semiconductor processes.

Now, the measurement value of the sample shots for AGA measured according to the above-described method is described as Ai (wherein i represents the measurement shot No.), as shown in the following Expression.

[Expression 4]

$$Ai = \begin{pmatrix} xi \\ yi \end{pmatrix} \quad (4)$$

Also, the alignment mark design position coordinates of the sample shot are described as Di, as shown in the following Expression.

[Expression 5]

$$Di = \begin{pmatrix} Xi \\ Yi \end{pmatrix} \quad (5)$$

With AGA, the following linear coordinates conversion D'i is carried out using the six parameters (Sx, Sy, θx, θy, Bx, By) describing the positional offset of the wafer as described above.

[Expression 6]

$$D'i = \begin{pmatrix} Bx & -\theta y \\ \theta x & By \end{pmatrix} Di + \begin{pmatrix} Sx \\ Sy \end{pmatrix} \quad (6)$$

In this expression, approximations such as cos θ=1, sin θ=θ, θx*Bx=θx, θy*By=θy, and so forth, are used for simplification, since θx, θy, Bx, and By are minute values.

Figure 8:
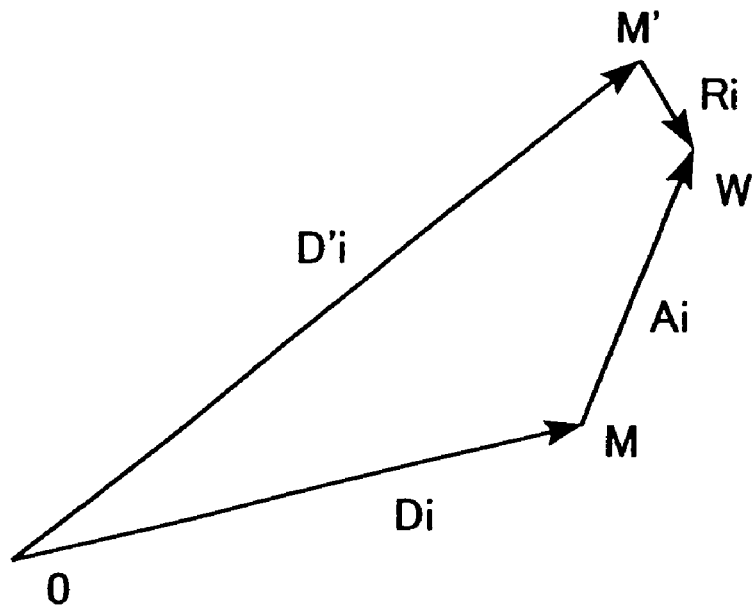
FIG. 8 is a diagram illustrating linear coordinates conversion and correction residual.

FIG. 8 illustrates the way in which the linear coordinates conversion shown in Expression (6) is carried out. An alignment mark on the wafer is at a position indicated by W, offset by an amount Ai from the designed position M, and performing the coordinates conversion D'i changes the positional offset (residual) of the alignment mark on the wafer to Ri.

[Expression 7]

$$Ri=(Di+Ai)-D'i \quad (7)$$

With AGA, the least-square method is used so that the residual Ri is minimal for each sample shot. That is to say, Sx, Sy, θx, θy, Bx, and By are calculated such that the mean square sum of the residual Ri is minimal.

[Expression 8]

$$V = \frac{1}{n} \sum_{i=n} |Ri|^2 \quad (8)$$

$$= \frac{1}{n} \sum_{i=1} \left| \begin{pmatrix} xi \\ yi \end{pmatrix} - \begin{pmatrix} Bx-1 & -\theta y \\ \theta x & By-1 \end{pmatrix} \begin{pmatrix} Xi \\ Yi \end{pmatrix} + \begin{pmatrix} Sx \\ Sy \end{pmatrix} \right|^2$$

[Expression 9]

$$\begin{pmatrix} \delta V/\delta Sx \\ \delta V/\delta Sy \\ \delta V/\delta \theta x \\ \delta V/\delta \theta y \\ \delta V/\delta Bx \\ \delta V/\delta By \end{pmatrix} = 0 \quad (9)$$

The measured values (xi, yi) at each sample shot and the alignment mark design positions (Xi, Yi) are substituted in the Expressions 8 and 9 to obtain the AGA parameters (Sx, Sy, θx, θy, Bx, By), and positioning for each of the shots on the wafer 12 is performed based on the AGA parameters, following which exposing is performed.

Figure 9:
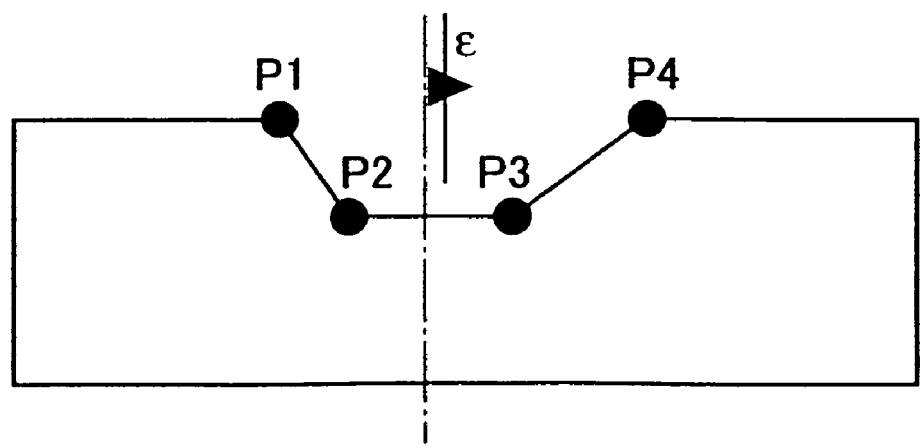
FIG. 9 is a non-symmetric mark model used for describing the first embodiment according to the present invention.
Figure 10:
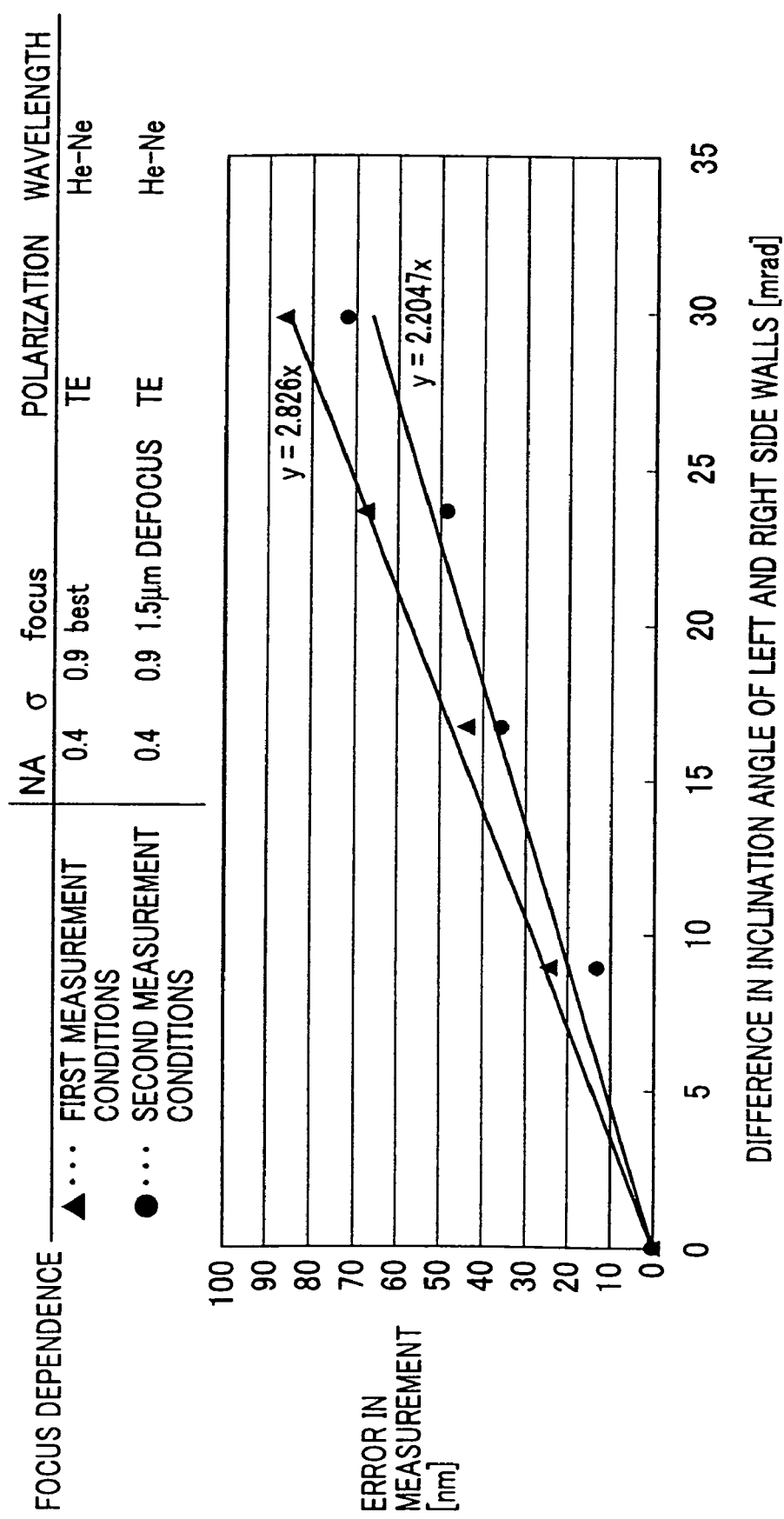
FIG. 10 is a diagram illustrating the relation between non-symmetry of marks and measurement error with the first embodiment according to the present invention.

Next, the change in the positional offset measurement values of the best focus signals and defocus signals in the event that there is non-symmetric error in the shape of the alignment mark 50 will be described. FIG. 9 shows a cross-sectional shape model of an alignment mark. With regard to a case wherein there is a difference in the angle of the inclination angle of the left side wall (P1-P2) and the angle of the inclination angle of the right side wall (P3-P4), first, the alignment image is calculated, following which the calculated error ε from the center position of P2 and P3 is calculated with regard to the best focus signals and defocus signals using template matching with Expression (3), the results of which are shown in FIG. 10. The conditions of the alignment detection optical system are: aperture (NA)=0.4, σ=0.9, and TE polarization light for the illumination light with a wavelength of 633 nm from a He—Ne laser (with the electrical field direction perpendicular to the drawing). The calculation results are for a case wherein the face of the wafer 12 is defocused by 1.5 μm from the best focus position. As shown in FIG. 10, the measurement error increases in proportion to the difference in angle between the left and right walls, and further, with the best focus signals and defocus signals, there is a difference between the rate of change in measurement error regarding a change of the difference in angle between the left and right walls.

Thus, a crucial point of the present embodiment is that the sensitivity of change in measurement regarding non-symmetry of marks differs between two measurement conditions. That is to say, the present embodiment takes advantage of the fact that the difference value of offset amounts measured under two measurement conditions is zero with highly symmetrical marks, but proportionately increases with an increase in non-symmetry thereof. With the measurement value of the first measurement condition (best focus signal) as M1 and the measurement value of the second measurement condition (defocus signal) as M2, M, which indicates the true positional offset (the amount of offset at the midpoint between P2 and P3 in FIG. 9), can be expressed by

[Expression 10]

$$M=M1-\alpha.(M1-M2) \quad (10)$$

wherein α is a non-symmetry error correction coefficient.

Figure 11:
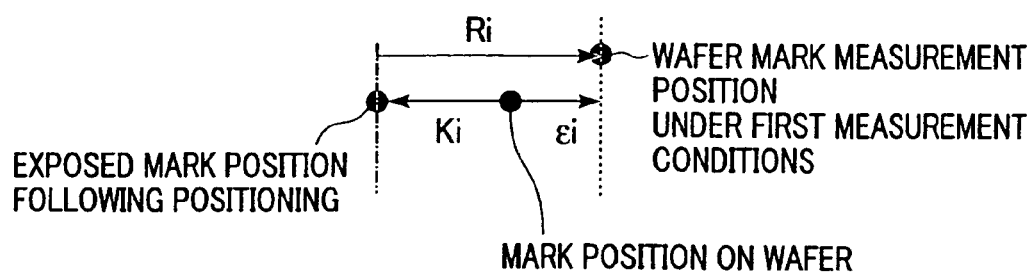
FIG. 11 is a diagram describing the relation between alignment measurement values and overlaying detection device measurement values, and measurement error.
Figure 12:
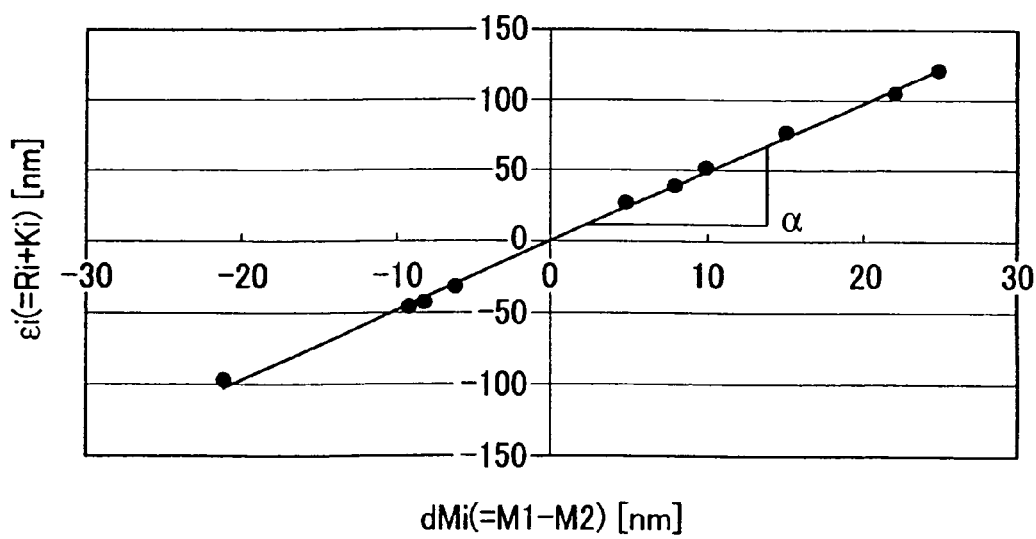
FIG. 12 is a diagram illustrating a method for calculating non-symmetric error correction values.

Next, the method for obtaining this non-symmetry error correction coefficient α will be described. A first method is to measure each sample shot under the first measurement conditions and second measurement conditions at the time of the above-described AGA (global alignment), store the measurement values and residual Ri for each shot, substitute the measured values (xi, yi) measured under the first measurement conditions at each sample shot and the alignment mark design positions (Xi, Yi) in the Expressions 8 and 9 to obtain the AGA parameters (Sx, Sy, θx, θy, Bx, By), and position each of the shots on the wafer 12 based on the AGA parameters, following which exposure is performed. At this time, a first overlaying evaluation mark is formed on the wafer 12 along with the alignment mark 50, and a second overlaying evaluation mark on the reticle 10 is transferred by exposure onto the resist on the first overlaying evaluation mark following AGA alignment. The positional offset amount of the first and second overlaying evaluation marks is measured for a sample shot for the AGA using an overlaying precision evaluation device. FIG. 11 shows the relation of these measurement values. The correction residual Ri (wherein i is the shot No.) measured by AGA and the measurement value Ki (wherein i is the shot No.) measured by the overlaying precision evaluation device should match with opposite signs, but in the event that there is non-symmetry in the alignment mark, these do not match by an error component εi due to the non-symmetry. The error component εi can be obtained by εi=Ri+Ki (wherein i is the shot No.). Next, the relation between the error component εi, and the difference value dMi (i.e., M1i−M2i) of the measurement value M1i under the first measurement conditions and the measurement value M2i under the second measurement conditions, is obtained. FIG. 12 illustrates the correlation of the values of dMi and εi for each shot and an approximation line obtained by the least-square method. Thus, an approximation line is obtained by the least-square method from the difference value (M1i−M2i) and the error component (Ri+Ki), and the inclination thereof is denoted by α. This method determines the value of the correction coefficient a based on the overlaying precision evaluation device. Also, those skilled in the art will be able to readily apply methods other than using an overlaying precision evaluation device, such as a method for obtaining the offset amount Ki following exposure based on electrical properties called electrical measurement, a method for obtaining Ki using a measuring SEM, and so forth.

Now, while a method has been described for obtaining the correction coefficient α, wherein exposure is performed following alignment, and the exposed wafer is inspected with an inspecting device, such as an overlaying precision evaluation device serving as a reference, an arrangement may be made wherein α is obtained such that the residual Ri of the AGA is minimal. That is, an arbitrary value is set for the correction coefficient α, the alignment mark positional offset amounts of each shot are set with Expression (10) and substituted into Expressions (8) and (9) to obtain the AGA parameters (Sx, Sy, θx, θy, Bx, By), the correction residual Ri is obtained with Expression (7), and the standard deviation (σ) is obtained (or, this may be the maximal value). The value of the correction coefficient is changed and the same processing is repeated, thereby obtaining a value wherein the residual Ri is minimal.

The reason that the combination wherein the residual is the smallest is used is that the residual amount is the sum of non-linear distortion caused by semiconductor processes and alignment measurement error (the sum of alignment precision and wafer state array precision), and the non-linear distortion is constant within the same wafer, so the smaller the residual is, the better the alignment measurement precision is. Also, an arrangement may be made wherein the above-described two methods are combined to determine the correction coefficient α for a first wafer in a semiconductor manufacturing lot (or the first several wafers thereof) using an overlaying precision evaluation device, or the like, so that the correction coefficient only needs to be fine-tuned from the next wafer on such that the residual R is minimal at a value near the value α of the leading wafer.

Figure 13:
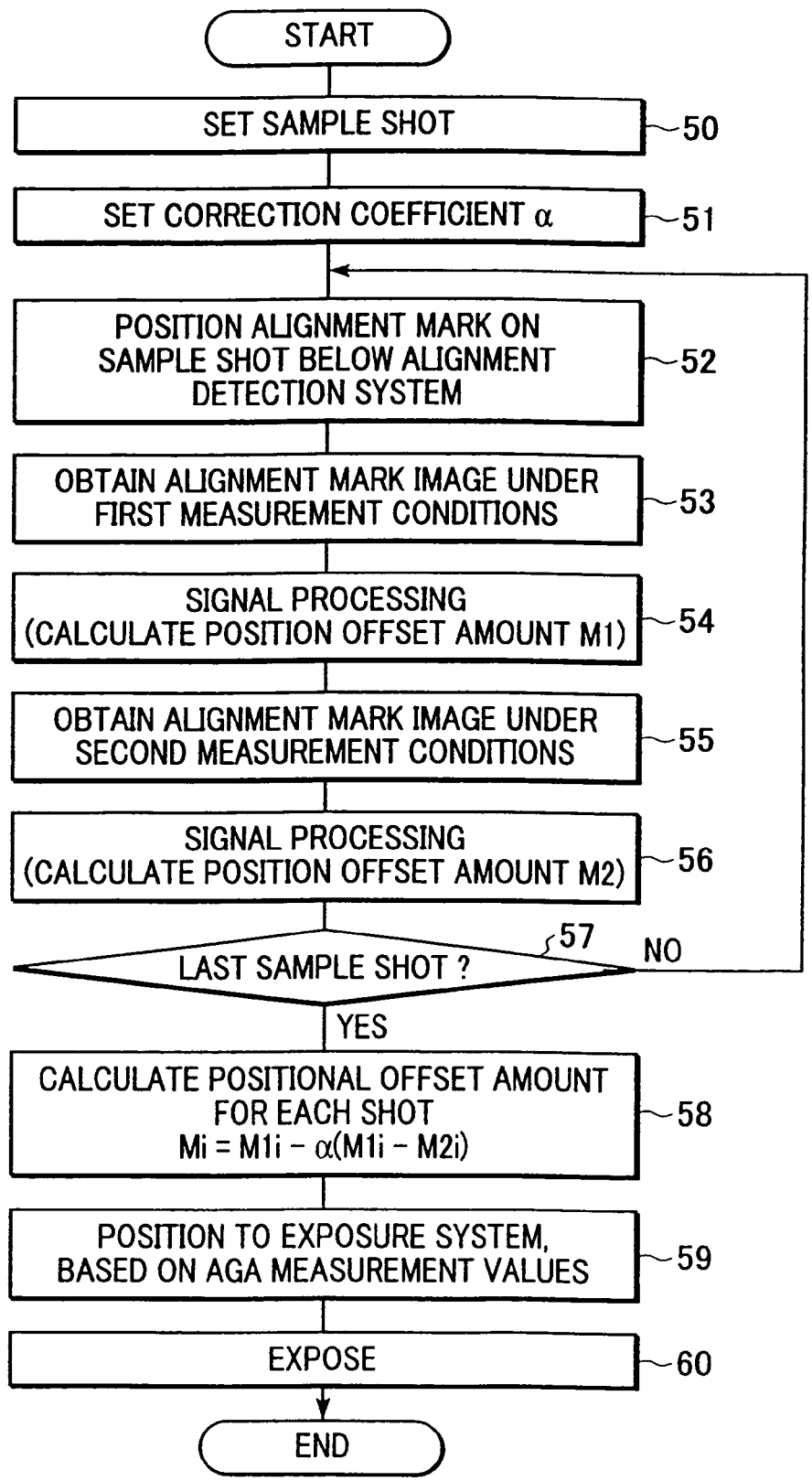
FIG. 13 is a diagram illustrating the alignment sequence of the present invention.

Next, the alignment sequence of the present invention will be described with reference to the flowchart shown in FIG. 13. In Step 50, which shot on the wafer is to be used for the AGA measurement shot is set. In the following Step 51, the value of the correction coefficient α determined as described above is set. In Step 52, the alignment mark within the sample shot on the wafer mounted on the wafer stage is positioned under the alignment detection system. In Step 53, an image of the alignment mark is obtained by the alignment detection system under the first measurement conditions. In Step 54, the positional offset amount M1 is calculated from the obtained alignment mark image, and stored in the exposure apparatus. In Step 55, an image of the alignment mark is obtained by the alignment detection system under the second measurement conditions. In Step 56, the positional offset amount M2 is calculated from the obtained alignment mark image, and stored in the exposure apparatus. Next, in Step 57, judgment is made regarding whether or not there are sample shots to be measured based on the information in Step 50, and in the event that there still are sample shots to be measured the flow returns to Step 52, so that measurement and signal processing is performed for all sample shots.

In Step 58, the mark offset amount Mi is obtained (wherein i is the shot No.), using the correction coefficient a set in Step 51, and the measurement value M1 obtained in Step 54 under the first measurement conditions and the measurement value M2 obtained in Step 56 under the second measurement conditions, by the expression $$Mi = M1i - \alpha(M1i - M2i).$$

The wafer is positioned as to the exposure system based on the AGA measurement values calculated in Step 59, and the pattern on the reticle is transferred by exposure onto the wafer in Step 60.

Figure 14:
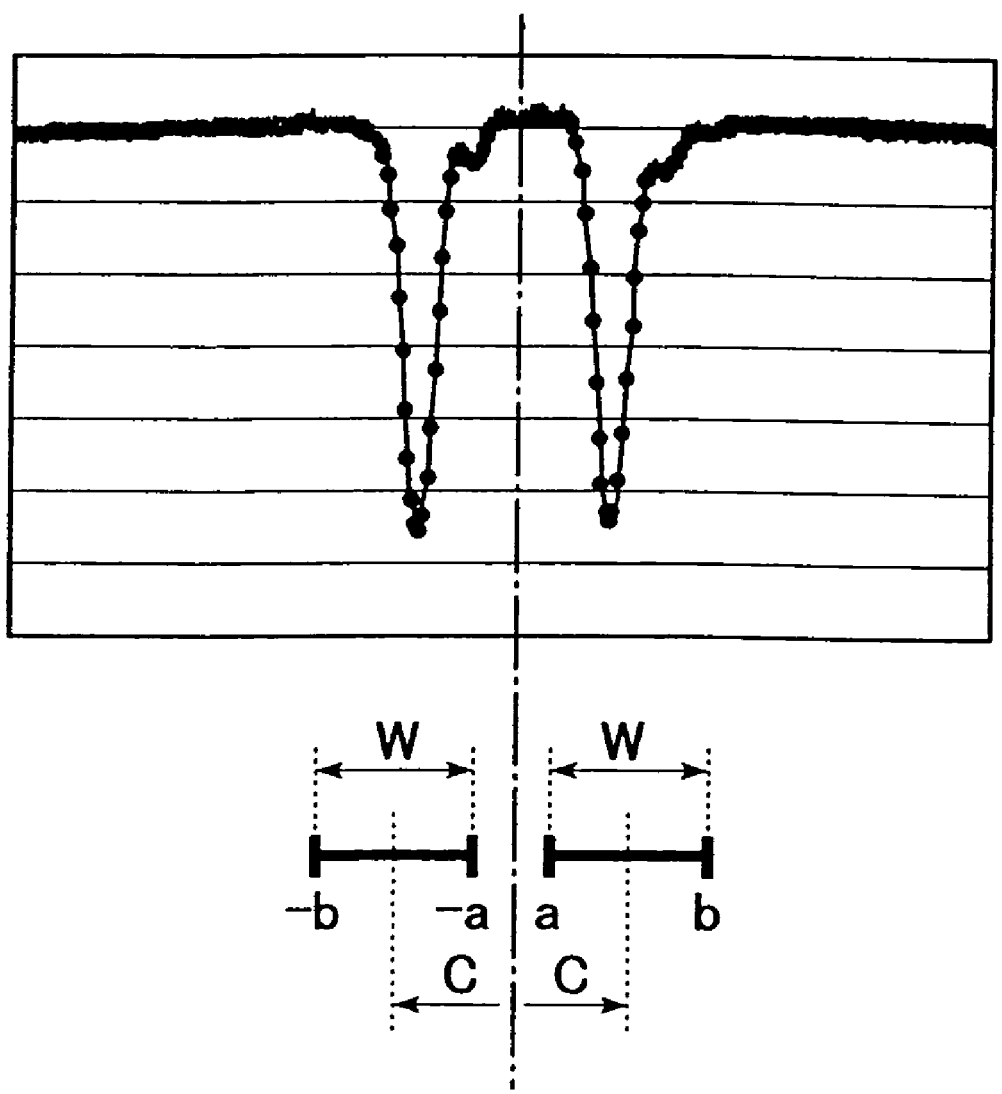
FIG. 14 is a diagram illustrating a second signal processing method according to the present invention.

Also, the following method can be used as processing for obtaining the position of the alignment mark image as well, besides the above-described template matching method. FIG. 14 illustrates a partial enlargement of the alignment mark image shown in FIG. 5, wherein the left half of the signal is a reflected template.

[Expression 11]

$$E(x) = \frac{1}{\sum_{J=a}^{b} |S(X-J) - S(X+J)|} \tag{11}$$

Expression (11) is the correlation value, taking the left half of the signal waveform to be a template. The position with the highest correlation is detected as the center of the positioning mark. With this correlation value function, resolution of 1/10 to 1/50 pixels can be achieved by obtaining the center-of-gravity pixel position of an area of several pixels in the horizontal direction from the peak pixel. The position of the other three alignment mark images on the sensor are detected as well. Subsequently, the average position Xa(n) of the marks is obtained by Expression (2), and the positional offset Xw(n) of the alignment mark 50 on the wafer is obtained by Expression (3).

Second Embodiment

Next, a second embodiment of the present invention will be described. While the first embodiment involved using best focus signals and defocus signals as two measurement conditions, the present embodiment is an example of a method wherein illumination light systems with different coherency (σ) are used to change sensitivity regarding non-symmetry of the alignment mark.

Figure 15:
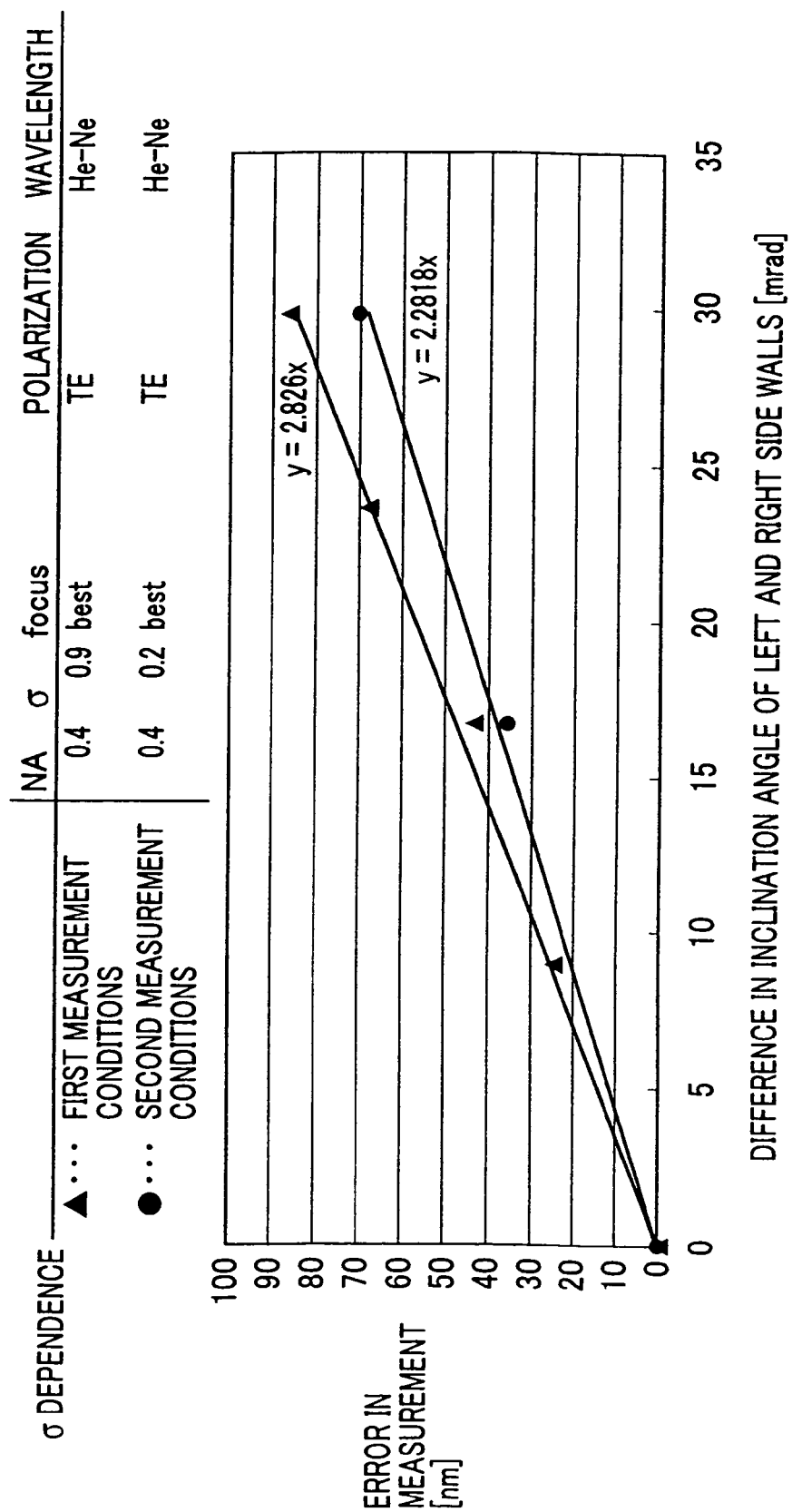
FIG. 15 is a diagram illustrating the relation between non-symmetry of marks and measurement error with a second embodiment according to the present invention.

FIG. 15 illustrates the simulation results serving as a basis for this method. FIG. 9 shows the cross-sectional shape model of an alignment mark, and, in the present embodiment, with regard to a case wherein there is a difference in the angle of the inclination angle of the left side wall (P1-P2) and the angle of the inclination angle of the right side wall (P3-P4), first, the alignment mark image is calculated, following which the positional offset amount ε from the center position of P2 and P3 is calculated with regard to differing coherency using template matching with Expression (3), the results of which are shown in FIG. 15. The conditions of the alignment detection optical system are: aperture (NA)=0.4, best focus, and TE polarization light for the illumination light with a wavelength of 633 nm from a He—Ne laser (with the electrical field direction perpendicular to the drawing). The calculation results are for σ=0.9 and σ=0.2. As shown in FIG. 15, with σ=0.9 signals and σ=0.2 signals, there is a difference between the rate of change in measurement error regarding a change of the difference in angle between the left and right walls. With the measurement value of the first measurement condition (σ=0.9) as M1 and the measurement value of the second measurement condition (σ=0.2) as M2, the true positional offset amount can be obtained by Expression (10).

Figure 16:
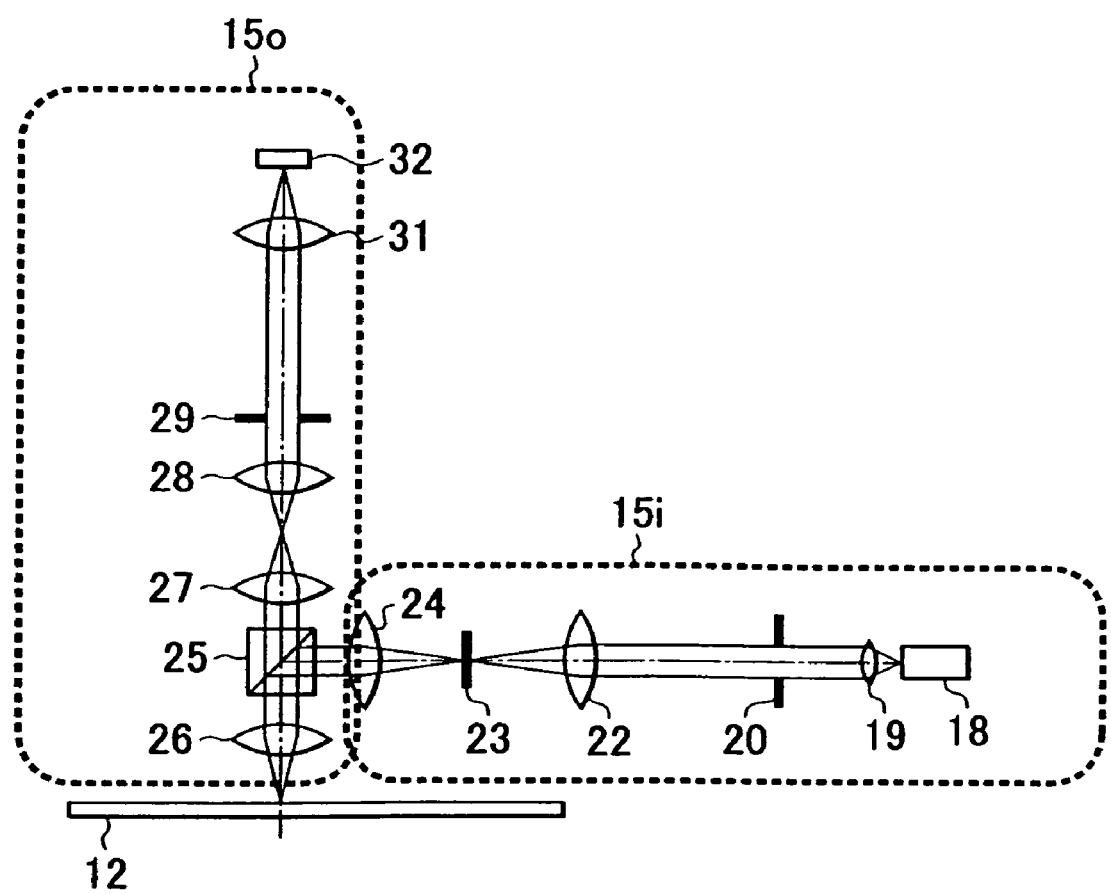
FIG. 16 is a diagram illustrating the alignment detection system of the second embodiment according to the present invention.

The exposure apparatus according to the present embodiment is as shown in FIG. 1, but the alignment detection system 15 differs from that described in the first embodiment, so the configuration of the alignment detection system will be described here. FIG. 16 illustrates the principal components of the alignment detection system used in the present embodiment. The alignment detection optical system 15 is configured of an illumination system 15i and an imaging system 15o, wherein illumination light from a light source 18 is enlarged at a lens 19 to become parallel rays, and then is collected again at a lens 22. The coherency (σ) of the illumination light is adjusted by a variable opening diaphragm 20. An aperture 23 is disposed at a position conjugate with the wafer 12, and serves as a view field aperture to prevent unnecessary light from being cast on the surrounding areas of the alignment marks on the wafer 12. The light collected by the lens 22 is formed into parallel rays again at the lens 24, reflected at a beam splitter 25, passes through a lens 26, and illuminates an alignment mark 50 on the wafer 12. The reflected light from the alignment mark 50 passes through the lens 26, beam splitter 25, lenses 27 and 28, and is received at a line sensor 32. The aperture (NA) of the imaging system can be adjusted by the variable opening diaphragm 29. The alignment mark 50 is enlarged at an imaging magnification of around one hundred times, and is imaged at the line sensor 32. Sequentially switching the coherency (σ) of the illumination light between 0.9 and 0.2 with the variable opening diaphragm 20 allows signals from the first measurement conditions, i.e., σ=0.9, and signals from the second measurement conditions, i.e., σ=0.2, to be obtained at the line sensor 32.

Note that the method for determining the correction coefficient α and the AGA (global alignment) method are the same as those with the first embodiment, and, accordingly, a description thereof will be omitted here.

Third Embodiment

Next, a third embodiment of the present invention will be described. The present embodiment is an example of a method wherein imaging systems with different apertures (NA) are used to change sensitivity regarding non-symmetry of the alignment mark.

Figure 17:
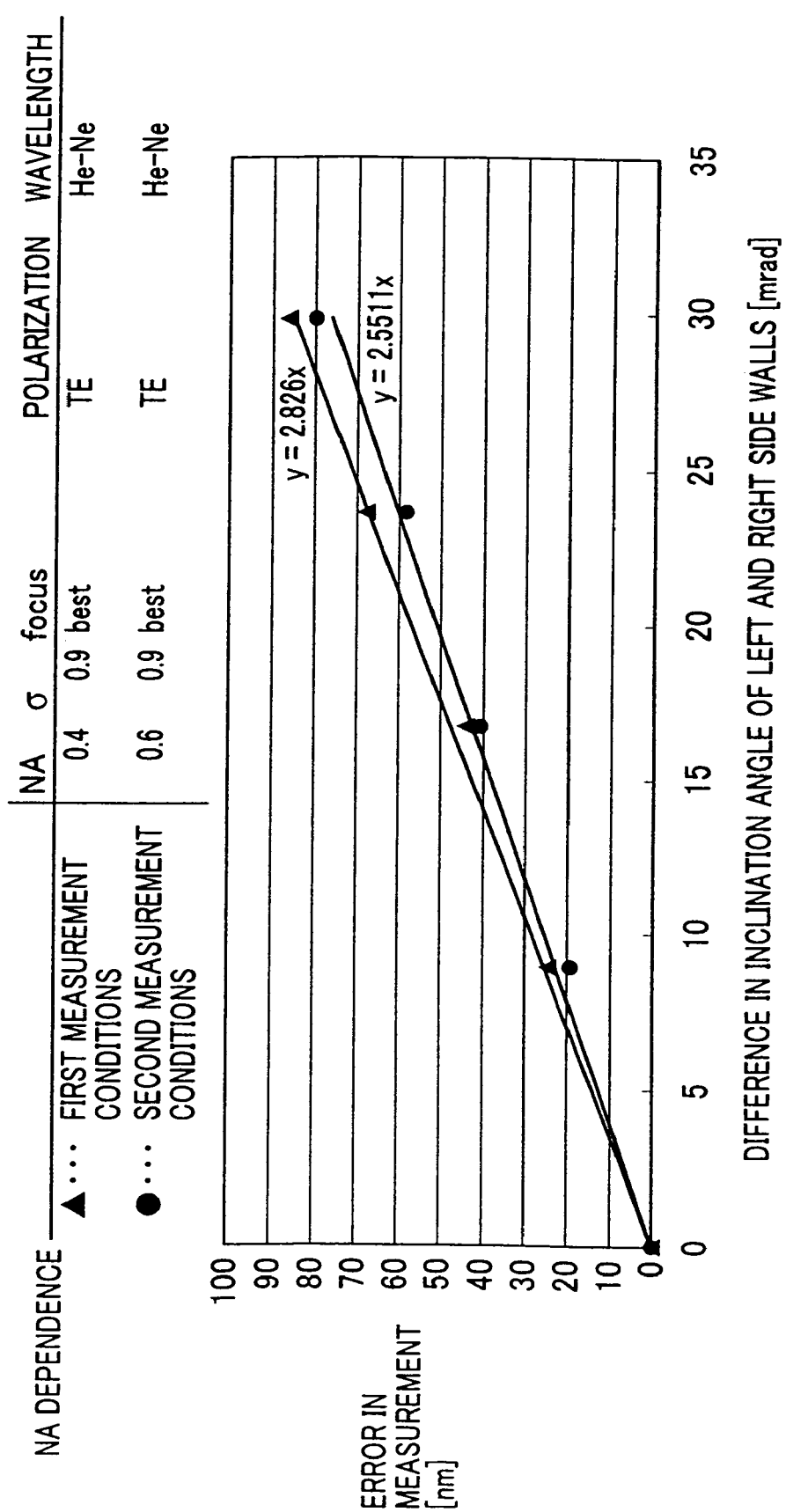
FIG. 17 is a diagram illustrating the relation between non-symmetry of marks and measurement error with a third embodiment according to the present invention.

FIG. 17 illustrates the simulation results serving as a basis for this method. FIG. 9 shows the cross-sectional shape model of an alignment mark, and in the present embodiment, with regard to a case wherein there is a difference in the angle of the inclination angle of the left side wall (P1-P2) and the angle of the inclination angle of the right side wall (P3-P4), first, the alignment mark image is calculated, following which the positional offset amount ε from the center position of P2 and P3 is calculated with regard to differing aperture signals using template matching with Expression (3), the results of which are shown in FIG. 17. The conditions of the alignment detection optical system are: σ=0.9, best focus, and TE polarization light for the illumination light with a wavelength of 633 nm from a He—Ne laser (with the electrical field direction perpendicular to the drawing). The calculation results are for aperture (NA)=0.4, and aperture (NA)=0.6. As shown in FIG. 17, with NA=0.4 signals and NA=0.6 signals, there is a difference between the rate of change in measurement error regarding a change of the difference in angle between the left and right walls. With the measurement value of the first measurement condition (NA=0.4) as M1 and the measurement value of the second measurement condition (NA=0.6) as M2, the true positional offset amount can be obtained by Expression (10).

Figure 18:
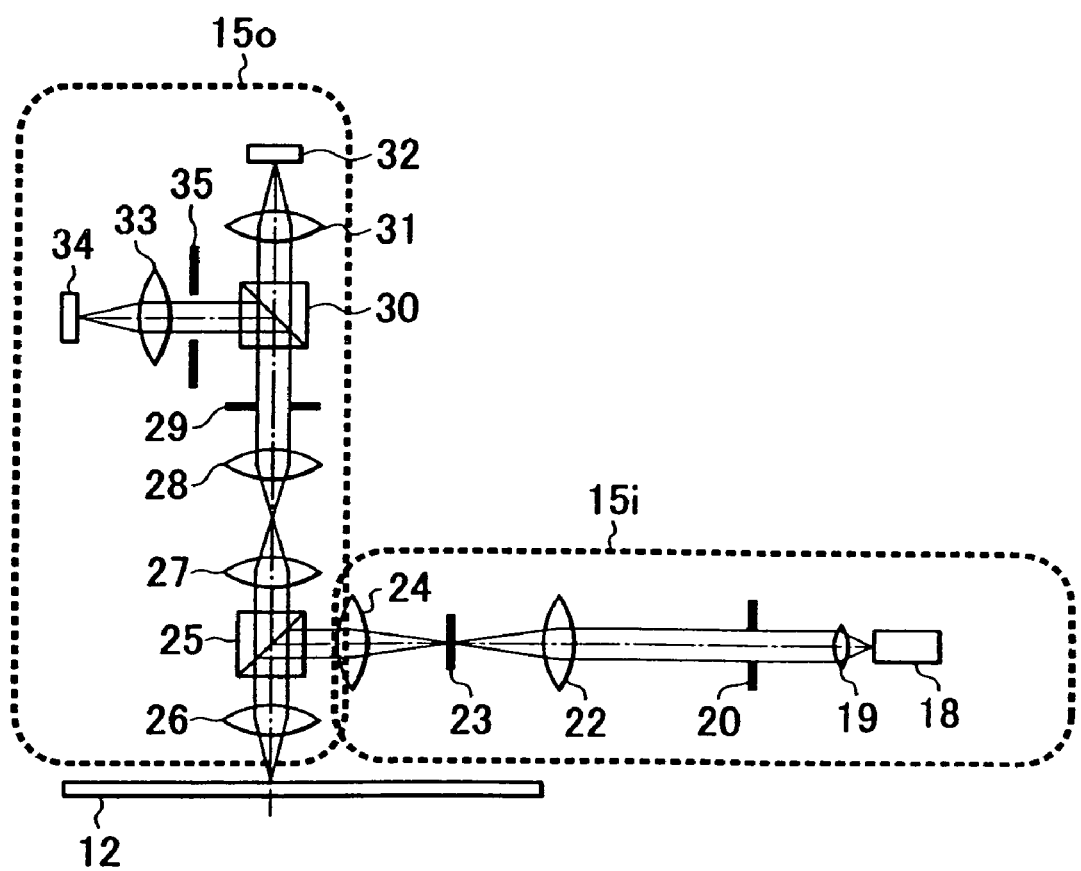
FIG. 18 is a diagram illustrating the alignment detection system of the third embodiment according to the present invention.

The exposure apparatus according to the present embodiment is as shown in FIG. 1, but the alignment detection system 15 differs from that described in the first embodiment, so the configuration of the alignment detection system will be described here. FIG. 18 illustrates the principal components of the alignment detection system used in the present embodiment. The alignment detection optical system 15 is configured of an illumination system 15i and an imaging system 15o, wherein illumination light from a light source 18 is enlarged at a lens 19 to become parallel rays, and then is collected again at a lens 22. The coherency (σ) of the illumination light is adjusted by a variable opening diaphragm 20. An aperture 23 is disposed at a position conjugate with the wafer 12, and serves as a view field aperture to prevent unnecessary light from being cast on the surrounding areas of the alignment marks on the wafer 12. The light collected by the lens 22 is formed into parallel rays again at the lens 24, reflected at a beam splitter 25, passes through a lens 26, and illuminates an alignment mark 50 on the wafer 12. The reflected light from the alignment mark 50 passes through the lens 26, beam splitter 25, lenses 27 and 28, is split at the beam splitter 30, and is received at line sensors 32 and 34. The aperture (NA) of the imaging system can be adjusted by variable opening diaphragms 29 and 35. The alignment mark 50 is enlarged at an imaging magnification of around one hundred times, and is imaged at the line sensor 32 as NA 0.6 signals. On the other hand, the image received by the line sensor 34 can be detected as NA 0.4 signals due to the variable opening diaphragm 35.

Note that the method for determining the correction coefficient α and the AGA (global alignment) method are the same as those with the first embodiment, and, accordingly, a description thereof will be omitted here.

Fourth Embodiment

Next, a fourth embodiment of the present invention will be described. The present embodiment is an example of a method wherein illumination systems with different polarization are used to change sensitivity regarding non-symmetry of the alignment mark.

Figure 19:
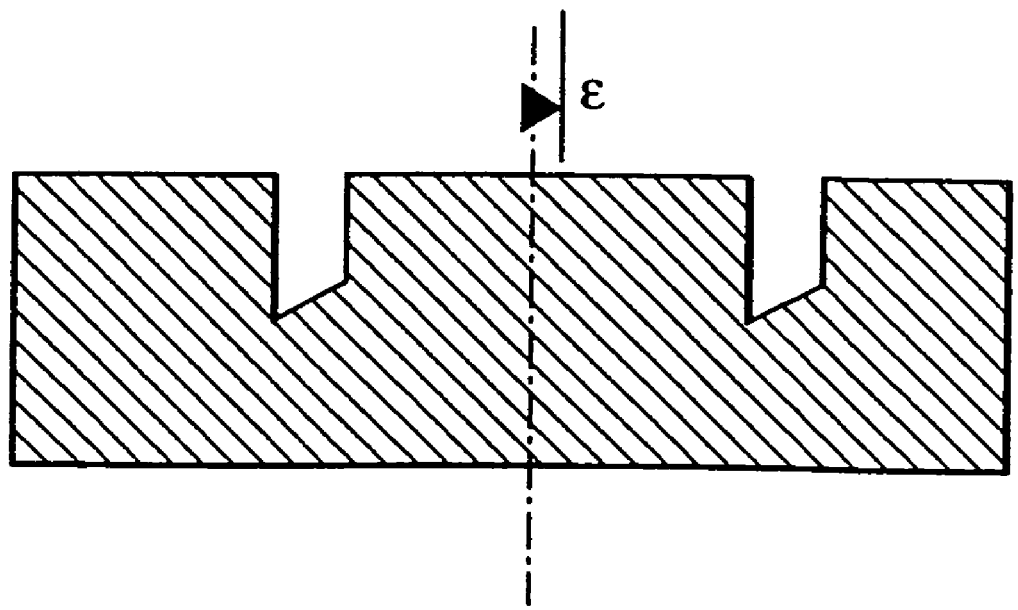
FIG. 19 is a non-symmetric mark model used for describing a fourth embodiment according to the present invention.
Figure 20:
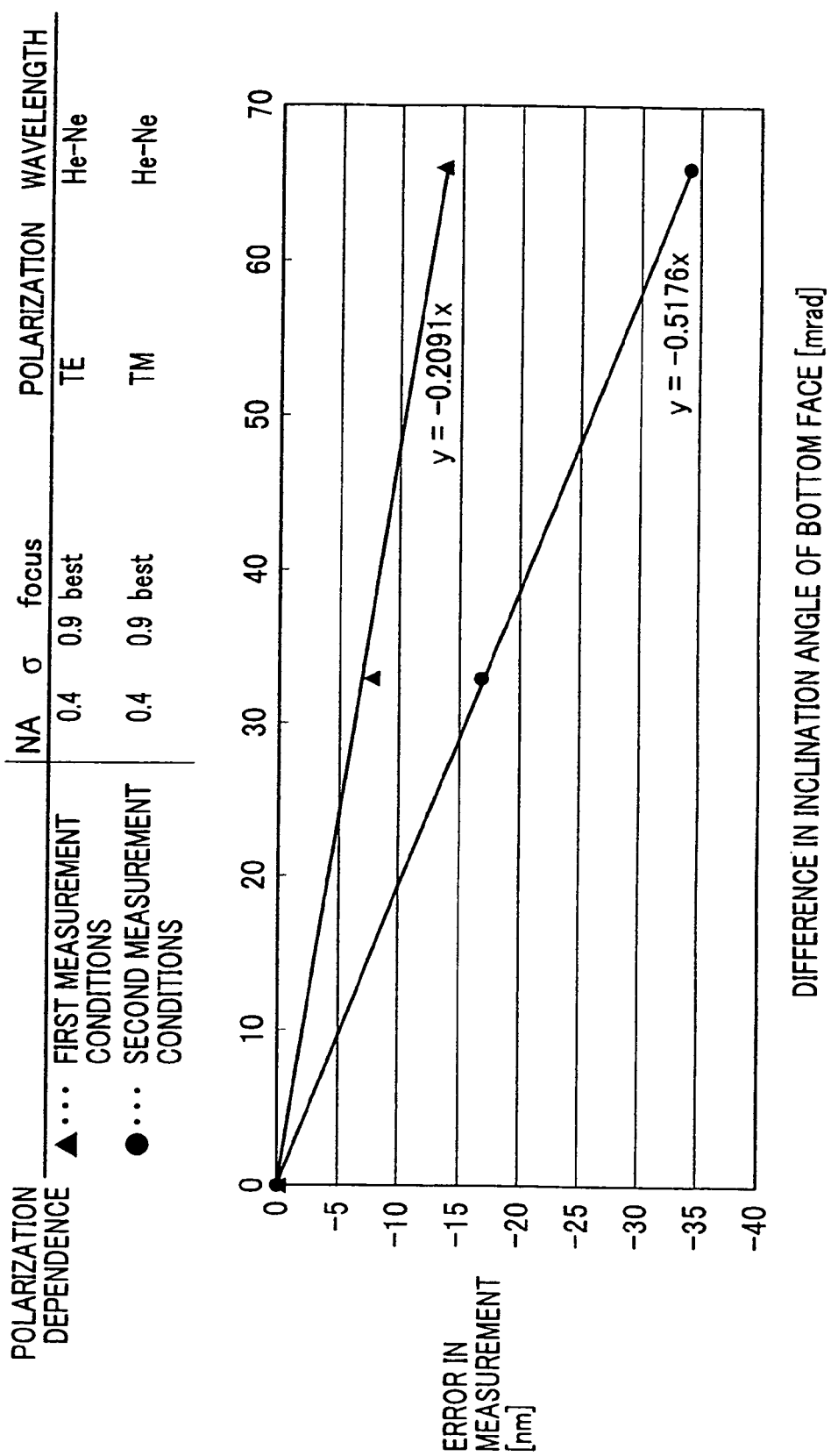
FIG. 20 is a diagram illustrating the relation between non-symmetry of marks and measurement error with the fourth embodiment according to the present invention.

FIG. 19 shows the cross-sectional shape model of an alignment mark. The alignment mark is such as shown in FIG. 4, and FIG. 20 illustrates the results obtained using template matching with Expression (3), with regard to signals of light cast in with different polarization, in a case wherein there is an inclination at the bottom (base face) of the mark. Here, first, the alignment mark image is calculated, following which the calculated error ε is calculated with regard to differing polarization signals using template matching with Expression (3), the results of which are shown in FIG. 20. The conditions of the alignment detection optical system are: NA=0.4, σ=0.9, best focus, and wavelength of 633 nm from a He—Ne laser. The calculation results are for TE polarization (with the electrical field direction perpendicular to the drawing), and TM polarization, for the polarized illumination light. As shown in FIG. 20, with TE polarized light and TM polarized light, there is a difference between the rate of change in measurement error regarding a change of the inclination angle of the lower face. With the measurement value of the first measurement condition (TE polarized light signals) as M1 and the measurement value of the second measurement condition (TM polarized light signals) as M2, the true positional offset amount can be obtained by Expression (10).

Figure 21:
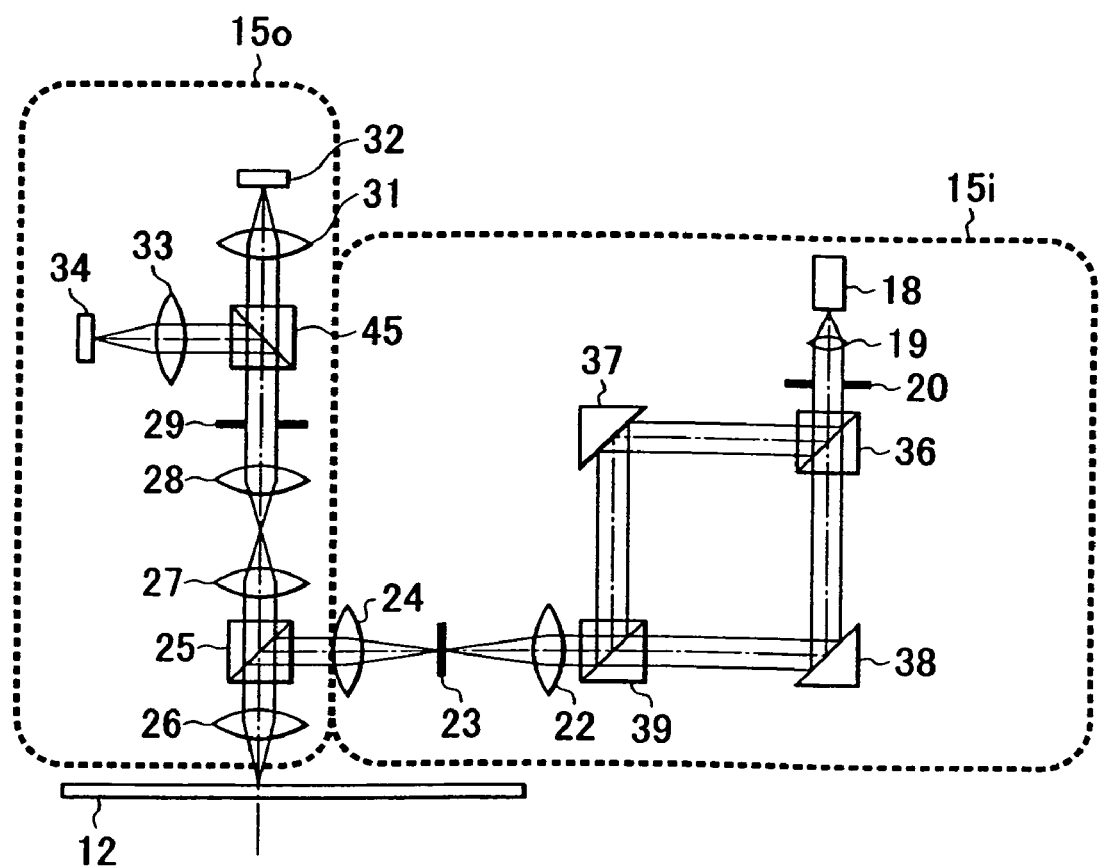
FIG. 21 is a diagram illustrating the alignment detection system of the fourth embodiment according to the present invention.

The exposure apparatus according to the present embodiment is as shown in FIG. 1, but the alignment detection system 15 differs from that described in the first embodiment, so the configuration of the alignment detection system will be described here. FIG. 21 illustrates the principal components of the alignment detection system used in the present embodiment. The alignment detection optical system 15 is configured of an illumination system 15i and an imaging system 15o, wherein illumination light from a light source 18 is enlarged at a lens 19 to become parallel rays, split at a polarization beam splitter 36, with the S polarization light (TE polarized light) being reflected at a mirror 37, and cast into a polarization beam splitter 39. Also, the P polarization light (TM polarized light), which has been transmitted through a polarization beam splitter 36 is reflected off of a mirror 38, and is cast into the polarization beam splitter 39. The light joined by the polarization beam splitter 39 then is collected again at a lens 22. The coherency (σ) of the illumination light is adjusted by a variable opening diaphragm 20. An aperture 23 is disposed at a position conjugate with the wafer 12, and serves as a view field aperture to prevent unnecessary light from being cast on the surrounding areas of the alignment marks on the wafer 12. The light collected by the lens 22 is formed in to parallel rays again at the lens 24, reflected at a beam splitter 25, passes through a lens 26, and illuminates an alignment mark 50 on the wafer 12. The reflected light from the alignment mark 50 passes through the lens 26, beam splitter 25, lenses 27 and 28, is split at a polarization beam splitter 45, and is received at line sensors 32 and 34. The aperture (NA) of the imaging system can be adjusted by a variable opening diaphragm 29. The alignment mark 50 is enlarged at an imaging magnification of around one hundred times, and the light which has been transmitted through the polarization beam splitter 45 is imaged at the line sensor 32 as P polarization light (TM polarized light) signals. On the other hand, the light reflected off of the polarization beam splitter 45 is received by the line sensor 34, and can be detected as S polarization light (TE polarized light) signals.

Note that the method for determining the correction coefficient α and the AGA (global alignment) method are the same as those with the first embodiment, and, accordingly, a description thereof will be omitted here.

Fifth Embodiment

Next, a fifth embodiment of the present invention will be described. The present embodiment is an example of a method wherein two types of illumination conditions, i.e., broadband light (BB light) with a wide wavelength band, and single-wavelength He—Ne beams, are used to change sensitivity regarding non-symmetry of the alignment mark.

Figure 22:
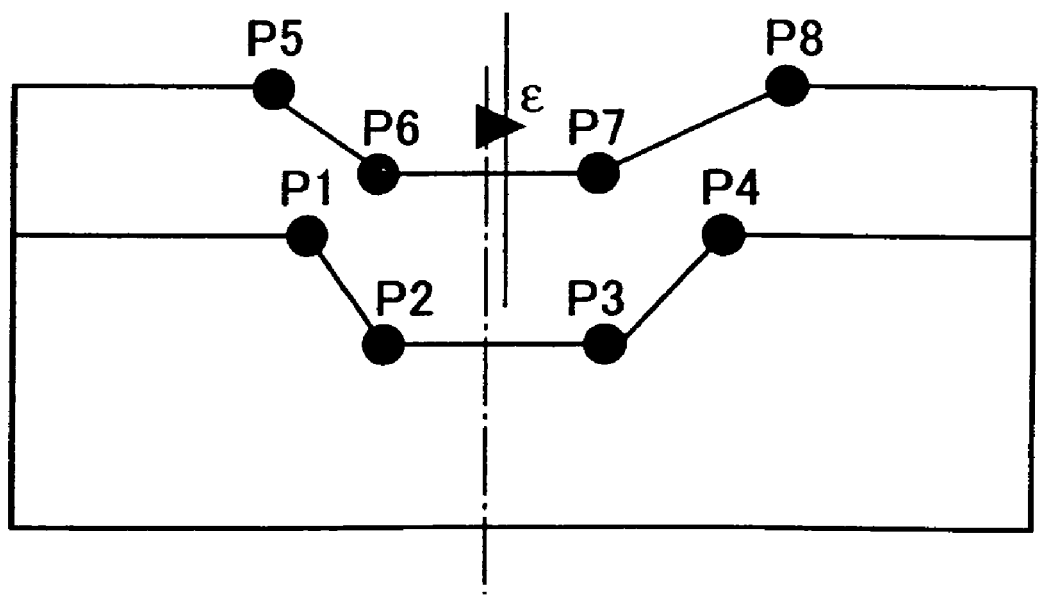
FIG. 22 is a non-symmetric mark model used for describing a fifth embodiment according to the present invention.
Figure 23:
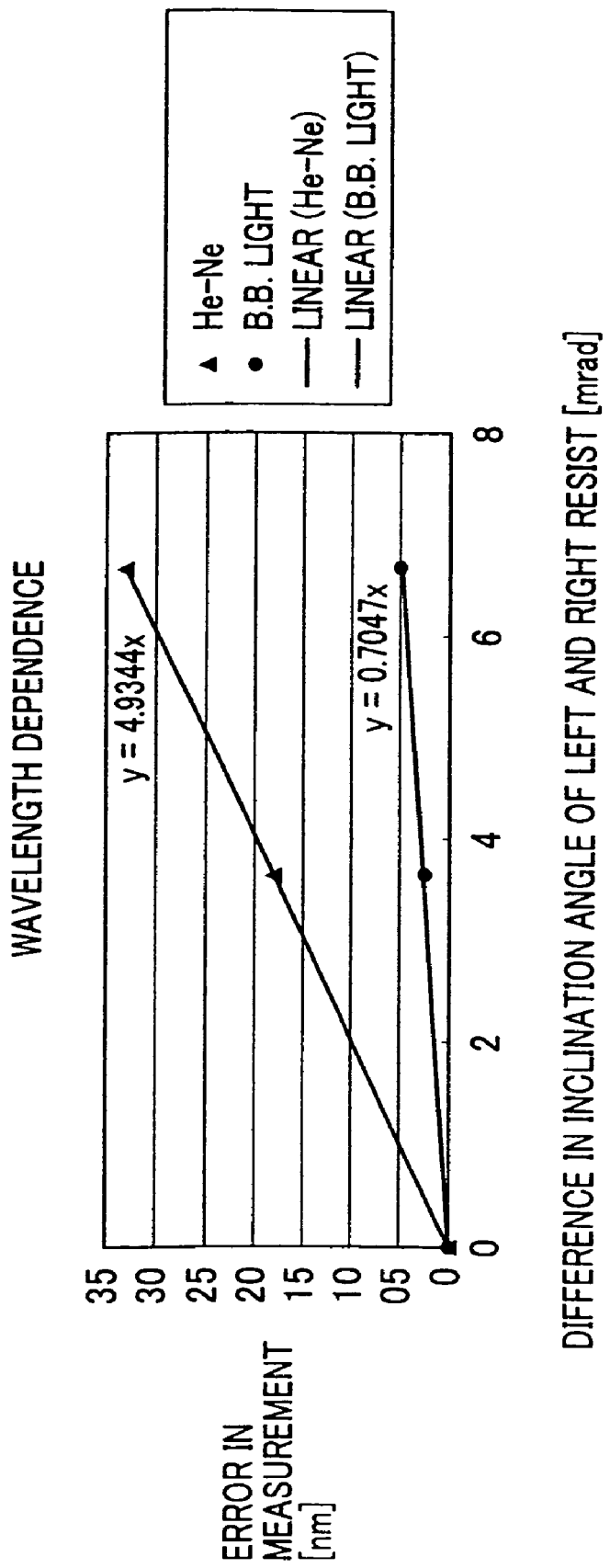
FIG. 23 is a diagram illustrating the relation between non-symmetry of marks and measurement error with the fifth embodiment according to the present invention.

FIG. 22 shows the cross-sectional shape model of an alignment mark. The alignment mark is a model of a case wherein the resist film (P5-P6-P7-P8) on a symmetrical base mark (P1-P2-P3-P4) has become non-symmetrical due to irregularities in coating. With regard to a case wherein there is a difference in the inclination angle of the left side slope (P5-P6) and the right side slope (P7-P8) of the resist, the alignment mark image is simulated and the measurement error ε is calculated with regard to the broadband light and single-wavelength signals using template matching with Expression (3), the results of which are shown in FIG. 23. The conditions of the alignment detection optical system are: NA =0.4, σ=0.9, best focus, and TE polarized light for the illumination light. The calculation results are for wavelengths of 633 nm from a He—Ne laser, and broadband light from 580 nm to 680 nm. As shown in FIG. 23, with single-wavelength signals and broadband light signals, there is a difference between the rate of change in measurement error regarding a change of the difference in angle between the left and right slopes of the surface of the resist. With the measurement value of the first measurement condition (BB light signals) as M1 and the measurement value of the second measurement condition (He—Ne wavelength signals) as M2, the true positional offset amount can be obtained by Expression (10).

Figure 24:
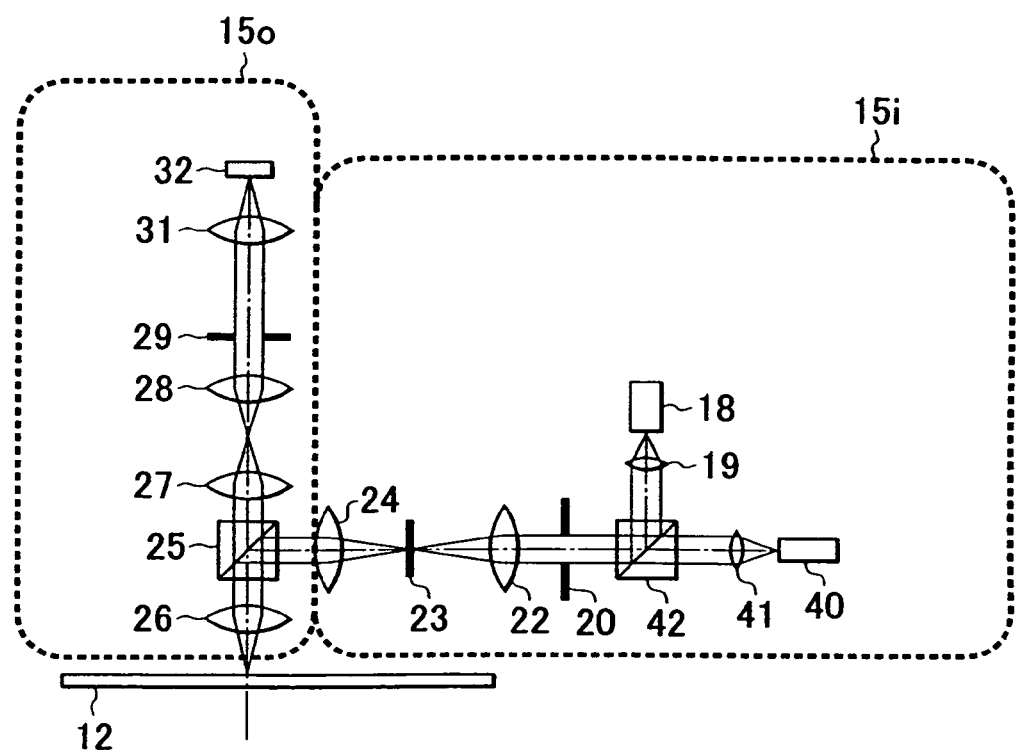
FIG. 24 is a diagram illustrating the alignment detection system of the fifth embodiment according to the present invention.

The exposure apparatus according to the present embodiment is as shown in FIG. 1, but the alignment detection system 15 differs from that described in the first embodiment, so the configuration of the alignment detection system will be described here. FIG. 24 illustrates the principal components of the alignment detection system used in the present embodiment. The alignment detection optical system 15 is configured of an illumination system 15i and an imaging system 15o, wherein illumination light from a He—Ne laser light source 18 is enlarged at a lens 19 to become parallel rays, and cast into a beam splitter 42. On the other hand, illumination light from a broadband light source 40 is enlarged at a lens 41 to become parallel rays, and cast into the beam splitter 42. Both light fluxes emitted from the light sources 18 and 40 are joined so as to pass through the same optical path at the beam splitter 42, and then emitted therefrom and collected at a lens 22. The coherency (σ) of the illumination light is adjusted by a variable opening diaphragm 20. An aperture 23 is disposed at a position conjugate with the wafer 12, and serves as a view field aperture to prevent unnecessary light from being cast on the surrounding areas of the alignment marks on the wafer 12. The light collected by the lens 22 is formed into parallel rays again at the lens 24, reflected at a beam splitter 25, passes through a lens 26, and illuminates an alignment mark 50 on the wafer 12. The reflected light from the alignment mark 50 passes through the lens 26, beam splitter 25, lenses 27 and 28, and is received at line sensor 32. The aperture (NA) of the imaging system can be adjusted by variable opening diaphragm 29. The alignment mark 50 is enlarged at an imaging magnification of around one hundred times, and is imaged at the line sensor 32. Sequentially switching the illumination light allows signals from He—Ne laser wavelength and the broadband light, to be obtained. While the present embodiment has been described using the broadband light and single-wavelength He—Ne laser beams, an arrangement may be made wherein a 488 nm Ar laser is used instead of the broadband light source shown in FIG. 24 to obtain the two signals from two different light source wavelengths.

Note that the method for determining the correction coefficient cc and the AGA (global alignment) method are the same as those with the first embodiment, and, accordingly, a description thereof will be omitted here.

Now, a description has been made so far regarding different sensitivity to non-symmetry of alignment marks by changing the focus, σ, NA, polarization, wavelength (single-wavelength and broadband light), and so forth, of the alignment measurement conditions. While a description has been made regarding changing the conditions individually, it is clear that similar advantages can be obtained by using arbitrary combinations of two or more of these parameters under two measurement conditions. Anyone skilled in the art would be readily able to conceive a configuration for such an alignment detection system as a modification of the alignment detection system described in the present specification.

Next, a method for applying wafers from the same semiconductor process to alignment detection optical systems in multiple exposure apparatuses will be described. In such a case, there is the need to manage the measurement error TIS (Tool Induced Shift) due to the alignment detection optical system. The primary cause of TIS is non-symmetrical aberration of the alignment detection optical system, and, in particular, coma aberration and telecentricity of the illumination system (the degree of perpendicularity of the primary beam as to the wafer) are major factors. With alignment detection optical systems with great TIS, the non-symmetry of alignment marks may expand into great measurement error.

Accordingly, in the event of using multiple exposure apparatuses, it is best to manage the TIS of the alignment detection optical systems in the exposure apparatuses in the event of using multiple exposure apparatuses, such that the same non-symmetry error correction coefficient α is applied for exposure apparatuses having alignment detection optical systems with TIS within a predetermined threshold value, and that the correction coefficient α is separately obtained as described above for exposure apparatuses having alignment detection optical systems with TIS exceeding the threshold value.

What is claimed is:

1. A position detection method of detecting a position of a non-symmetrical mark, said method comprising steps of:
    detecting light from the mark under a first detecting condition to measure a position of the mark as first position information;
    detecting light from the mark under a second detecting condition to measure a position of the mark as second position information; and
    detecting the position of the mark by weighting the first position information by multiplying the first position information by a first coefficient to generate first weighted position information and weighting the second position information by multiplying the second position information by a second coefficient to generate second weighted position information, and adding the first weighted position information and the second weighted position information to determine the position of the mark,
    wherein (i) the first and second detecting conditions are determined so that a difference value between the first position information and the second position information proportionately increase with an increase in non-symmetry of the mark, and (ii) the first and second detecting conditions are different from each other in one of focus state of an image of the mark, a coherence factor of an illumination optical system for illuminating the mark, a numerical aperture of an imaging optical system for imaging the mark, and a polarization state of light for illuminating the mark.

2. The position detection method of claim 1, wherein the mark is a recessed alignment mark.

3. The position detection method of claim 1, wherein the first and second position information is determined by template matching.

4. An exposure apparatus for transferring a pattern to a workpiece, said apparatus comprising:
    means for detecting light from a mark under a first detecting condition to measure a position of the mark as first position information, wherein the mark is non-symmetrical;
    means for detecting light from the mark under a second detecting condition to measure a position of the mark as second position information;
    position detecting means for detecting the position of the mark by weighting the first position information by multiplying the first position information by a first coefficient to generate first weighted position information and weighting the second position information by multiplying the second position information by a second coefficient to generate second weighted position information, and adding the first weighted position information and the second weighted position information to determine the position of the mark; and
    means for aligning the workpiece based on the position of the mark detected by said position detecting means,
    wherein (i) the first and second detecting conditions are determined so that a difference value between the first position information and the second position information proportionately increase with an increase in non-symmetry of the mark, and (ii) the first and second detecting conditions are different from each other in one of focus state of an image of the mark, a coherence factor of an illumination optical system for illuminating the mark, a numerical aperture of an imaging optical system for imaging the mark, and a polarization state of light for illuminating the mark.

5. A method of manufacturing a device, said method comprising steps of:
    transferring a pattern to a workpiece using an exposure apparatus as defined in claim 4;
    developing the workpiece to which the pattern has been transferred; and
    processing the developed workpiece to manufacture the device.

6. The exposure apparatus of claim 4, wherein the mark is a recessed alignment mark.

7. The exposure apparatus of claim 4, wherein the first and second position information is determined by template matching.

8. An exposure apparatus for transferring a pattern to a workpiece, said apparatus comprising:
    an optical system for detecting light from a mark under a first detecting condition to measure a position of the mark as first position information, and for detecting light from the mark under a second detecting condition to measure a position of the mark as second position information, wherein the mark is non-symmetrical;
    an alignment signal processor for determining the position of the mark by weighting the first position information by multiplying the first position information by a first coefficient to generate first weighted position information and weighting the second position information by multiplying the second position information by a second coefficient to generate second weighted position information, and adding the first weighted position information and the second weighted position information to determine the position of the mark; and
    a stage device for aligning the workpiece based on the position of the mark determined by said alignment signal processor,
    wherein (i) the first and second detecting conditions are determined so that a difference value between the first position information and the second position information proportionately increase with an increase in non-symmetry of the mark, and (ii) the first and second detecting conditions are different from each other in one of focus state of an image of the mark, a coherence factor of an illumination optical system for illuminating the mark, a numerical aperture of an imaging optical system for imaging the mark, and a polarization state of light for illuminating the mark.

9. The exposure apparatus of claim 8, wherein said optical system comprises a first sensor for detecting light from the mark under the first detecting condition to measure the position of the mark as the first position information, and a second sensor for detecting light from the mark under the second detecting condition to measure the position of the mark as the second position information.

10. The exposure apparatus of claim 8, wherein said optical system comprises a sensor for detecting light from the mark under the first detecting condition and for detecting light from the mark under the second detecting condition.

11. The exposure apparatus of claim 8, wherein said optical system comprises at least one of a line sensor for detecting the position of the mark in the direction of the optical axis and a two-dimensional area sensor for detecting the cross-sectional area of the mark.

12. The exposure apparatus of claim 8, wherein the mark is a recessed alignment mark.

13. The exposure apparatus of claim 8, wherein the first and second position information is determined by template matching.

14. A method of manufacturing a device, said method comprising steps of:
   transferring a pattern to a workpiece using an exposure apparatus as defined in claim 8;
   developing the workpiece to which the pattern has been transferred; and
   processing the developed workpiece to manufacture the device.

\* \* \* \* \*